(12) United States Patent
Agazzi et al.

(10) Patent No.: US 7,835,387 B2
(45) Date of Patent: *Nov. 16, 2010

(54) METHODS AND SYSTEMS FOR DIGITALLY PROCESSING DATA SIGNALS

(75) Inventors: Oscar Agazzi, Irvine, CA (US);
Venugopal Gopinathan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/496,211

(22) Filed: Jul. 1, 2009

(65) Prior Publication Data

US 2009/0310665 A1 Dec. 17, 2009

Related U.S. Application Data

(63) Continuation of application No. 09/909,896, filed on Jul. 23, 2001, now Pat. No. 7,564,866.

(60) Provisional application No. 60/219,918, filed on Jul. 21, 2000, provisional application No. 60/273,215, filed on Mar. 1, 2001.

(51) Int. Cl.
*H04L 12/66* (2006.01)

(52) U.S. Cl. .................. 370/463; 370/290; 370/466; 370/467; 370/497; 375/144; 375/229; 375/232; 375/233; 375/260; 375/262; 375/264; 375/265; 375/267; 375/316; 375/340; 375/341; 375/342; 375/347; 375/348; 375/349; 375/350; 375/355; 710/69; 398/79; 398/82; 398/140; 398/141; 398/158; 398/202; 398/208

(58) Field of Classification Search ............... 370/290, 370/463, 466, 467, 497; 375/144, 229, 232, 375/233, 260, 262, 264, 265, 267, 316, 340, 375/341, 342, 347, 350, 355; 710/69; 398/79, 398/82, 140, 141, 158, 202, 208
See application file for complete search history.

(56) References Cited

U.S. PATENT DOCUMENTS 4,837,821 A * 6/1989 Kage .................. 380/274

(Continued)

FOREIGN PATENT DOCUMENTS

EP 0 483 439 6/1992

(Continued)

OTHER PUBLICATIONS

"Progress Report on Equalization of Multimode Fibers," presented at IEEE 802.3ae Equalization Ad Hoc meeting, Irvine, California, Jan. 10, 2001, pp. 1-16. cited by other.

(Continued)

*Primary Examiner*—Brian D Nguyen
*Assistant Examiner*—Toan D Nguyen
(74) *Attorney, Agent, or Firm*—Sterne, Kessler, Goldstein & Fox P.L.L.C.

(57) ABSTRACT

Digital signal processing based methods and systems for receiving electrical and/or optical data signals include electrical receivers, optical receivers, parallel receivers, multi-channel receivers, timing recovery schemes, and, without limitation, equalization schemes. The present invention is implemented as a single path receiver. Alternatively, the present invention is implemented as a multi-path parallel receiver in which an analog-to-digital converter ("ADC") and/or a digital signal processor ("DSP") are implemented with parallel paths that operate at lower rates than the received data signal.

21 Claims, 33 Drawing Sheets

U.S. PATENT DOCUMENTS

| | | | |
|---|---|---|---|
| 5,115,450 A * | 5/1992 | Arcuri | 375/219 |
| 5,396,224 A | 3/1995 | Dukes et al. | |
| 5,485,490 A | 1/1996 | Leung et al. | |
| 5,550,546 A | 8/1996 | Noneman et al. | |
| 5,554,945 A | 9/1996 | Lee et al. | |
| 5,614,855 A | 3/1997 | Lee et al. | |
| 5,650,954 A | 7/1997 | Minuhin | |
| 5,703,905 A | 12/1997 | Langberg | |
| 5,757,857 A | 5/1998 | Buchwald | |
| 5,768,268 A | 6/1998 | Kline et al. | |
| 5,822,143 A | 10/1998 | Cloke et al. | |
| 5,852,477 A * | 12/1998 | Limberg | 348/725 |
| 5,881,107 A | 3/1999 | Termerinac et al. | |
| 5,881,108 A | 3/1999 | Herzberg et al. | |
| 5,945,862 A | 8/1999 | Donnelly et al. | |
| 5,949,820 A | 9/1999 | Shih et al. | |
| 5,966,415 A | 10/1999 | Bliss et al. | |
| 6,002,279 A | 12/1999 | Evans et al. | |
| 6,005,445 A | 12/1999 | Katakura | |
| 6,009,534 A | 12/1999 | Chiu et al. | |
| 6,038,269 A | 3/2000 | Raghavan | |
| 6,122,336 A | 9/2000 | Anderson | |
| 6,134,268 A | 10/2000 | McCoy | |
| 6,329,859 B1 | 12/2001 | Wu | |
| 6,359,486 B1 | 3/2002 | Chen | |
| 6,397,048 B1 | 5/2002 | Toda | |
| 6,404,525 B1 | 6/2002 | Shimomura et al. | |
| 6,498,694 B1 | 12/2002 | Shah | |
| 6,509,773 B2 | 1/2003 | Buchwald et al. | |
| 6,621,862 B1 | 9/2003 | Dabell | |
| 6,791,388 B2 | 9/2004 | Buchwald et al. | |
| 6,842,458 B1 | 1/2005 | Reznic | |
| 7,564,866 B2 | 7/2009 | Agazzi et al. | |
| 2002/0034222 A1 | 3/2002 | Buchwald et al. | |
| 2002/0039395 A1 | 4/2002 | Buchwald et al. | |
| 2002/0044617 A1 | 4/2002 | Buchwald et al. | |
| 2002/0044618 A1 | 4/2002 | Buchwald et al. | |
| 2002/0080898 A1 | 6/2002 | Agazzi et al. | |
| 2003/0086515 A1 | 5/2003 | Trans et al. | |
| 2004/0212416 A1 | 10/2004 | Buchwald et al. | |

FOREIGN PATENT DOCUMENTS

| | | |
|---|---|---|
| EP | 0 515 074 | 11/1992 |
| EP | 0 805 447 | 11/1997 |
| EP | 0 909 035 | 4/1999 |
| EP | 1006697 | 7/2000 |
| EP | 1 139 619 | 10/2001 |
| WO | WO 01/29991 | 4/2001 |
| WO | WO 01/54317 | 7/2001 |
| WO | WO 01/65788 | 9/2001 |
| WO | WO 01/84702 | 11/2001 |
| WO | WO 01/84724 | 11/2001 |
| WO | WO 02/13424 | 2/2002 |
| WO | WO 02/071616 | 9/2002 |

OTHER PUBLICATIONS

Agazzi, Oscar et al., "Interim Observations on Multimode Optical Channels," presented at IEEE 802.3ae Equalization Ad Hoc meeting, Tampa, Florida, Nov. 5, 2000, pp. 1-29. cited by other.
Agazzi, Oscar, "10Gb/s PMD Using PAM-5 Modulation," presented at IEEE 802.3, Dallas, Jan. 18-20, 2000, pp. 1-19. cited by other.
Agazzi, Oscar, E., "A Link Model for Equalized Optical Receivers," presented at IEEE 802.3ae Equalization Ad Hoc meeting, Hilton Head, South Carolina, Mar. 11, 2001, pp. 1-30. cited by other.
Agazzi, Oscar, et al., "10Gb/s PMD Using PAM-5 Trellis Coded Modulation," presented at IEEE 802.3ae 10Gb/s Task Force Plenary week meeting, Albuquerque, New Mexico, Mar. 7, 2000, pp. 1-38. cited by other.
Agazzi, Oscar, et al., "Algorithm to Postprocess Measured Data," presented at IEEE 802.3ae Equalization Ad Hoc meeting, Jan. 10, 2001, Irvine, California, pp. 1-11. cited by other.
Agazzi, Oscar, et al., "DSP-Based Equalization for Optical Channels: Feasibility of a VLSI Implementation," presented at IEEE 802.3ae 10Gb/s Task Force Interim meeting, New Orleans, Louisiana, Sep. 12, 2000, pp. 1-39. cited by other.
Agazzi, Oscar, et al., "Measurement of Non-Stationarity of 10 Gb/s Multimode Fiber Links," presented at IEEE P802.3ae 10Gb/s Ethernet Task Force Equalization Ad Hoc, Nov. 24, 2000, 5 pages. cited by other.
Agazzi, Oscar, et al., Measurements of DMD-Challenged Fibers at 3.125 Gb/s, presented at IEEE 802.3ae Equalization Ad Hoc meeting, Jan. 10, 2001, Irvine, California, pp. 1-33. cited by other.
Alderrou, Don et al., "XAUI/XGXS Proposal," IEEE 802.3ae Task Force, May 23-25, 2000, slides 1-26. cited by other.
Bhatt, Vipul, "Equalization Ad Hoc Concluding Report," presented at IEEE P802.3ae Equalization Ad Hoc meeting, Hilton Head, South Carolina, Mar. 11, 2001, pp. 1-12. cited by other.
Bingham, John A. C., "Multicarrier Modulation for Data Transmission: An Idea Whose Time Has Come," IEEE Communications Magazine, (May 1990), pp. 5-14. cited by other.
Chiddix, James A. et al., "AM Video on Fiber in CATV Systems: Need and Implementation," IEEE Journal on Selected Areas in Communications, vol. 8, No. 7 (Sep. 1990), pp. 1229-1239. cited by other.
Darcie, Thomas E., "Subcarrier Multiplexing for Lightwave Networks and Video Distribution Systems," IEEE Journal on Selected Areas in Communications. vol. 8, No. 7 (Sep. 1990), pp. 1240-1248. cited by other.
Fettweis, Gerhard, et al., "High-Rate Viterbi Processor: A Systolic Array Solution," IEEE, IEEE Journal on Selected Areas in Communications, vol. 8, No. 8, Oct. 1990, pp. 1520-1533. cited by other.
Fettweis, Gerhard, et al., "Parallel Viterbi Algorithm Implementation: Breaking the ACS-Bottleneck," IEEE, IEEE Transactions on Communications, vol. 37, No. 8, Aug. 1989, pp. 785-789. cited by other.
Forney, G. David, Jr., "The Viterbi Algorithm," IEEE, Proceedings of the IEEE, vol. 61, No. 3, Mar. 1973, pp. 268-278. cited by other.
Frazier, Howard, "10Gig MII update," IEEE 802.3 Higher Speed Study Group, Nov. 9, 1999, pp. 1-24. cited by other.
Giaretta, Giorgio, et al., "Adaptive Equalization of DMD Challenged Multimode Fiber at 1300 nm," presented at IEEE P802.3ae Equalization Ad Hoc meeting, Hilton, South Carolina, Mar. 11, 2001, 10 pages. cited by other.
Hatamian, Mehdi et al., "Design Considerations for Gigabit Ethernet 1000Base-T Twisted Pair Transceivers," Proceedings of the Custom Integrated Circuits Conference, May 11-14, 1998, pp. 335-342. cited by other.
International Search Report issued Aug. 23, 2002 for Appln. No. PCT/US01/23038, 7 pages. cited by other.
Isaacs, Matt, et al., "Measurements of Fiber Responses at 5Gb/s Data Rate Using 850nm VCSELs," presented at IEEE 802.3ae Equalization Ad Hoc meeting, Hilton Head, South Carolina, Mar. 11, 2001, pp. 1-18. cited by other.
Kanno, Norio and Ito, Katsuyoshi, "Fiber-Optic Subcarrier Multiplexing Video Transport Employing Multilevel QAM," IEEE Journal on Selected Areas in Communications, vol. 8, No. 7 (Sep. 1990), pp. 1313-1319. cited by other.
Kasper, B.L., "Equalization of Multimode Optical Fiber Systems," American Telephone and Telegraph Company, The Bell System Technical Journal, vol. 61, No. 7, Sep. 1982, pp. 1367-1388. cited by other.
Kasturia, Sanjay, et al., "Techniques for High-Speed Implementation of Nonlinear Cancellation," IEEE, IEEE Journal on Selected Areas in Communications, vol. 9, No. 5, Jun. 1991, pp. 711-717. cited by other.
Lenosky, Thomas, "A Unified Method of Calculating PMD-induced Pulse Broadening," presented at IEEE 802.3ae Equalization Ad Hoc meeting, Tampa, Florida, Nov. 5, 2000, 8 pages. cited by other.
Lenosky, Thomas, et al., "Five Gb/s Multimode DMD at 850 nm:Real-Time Data and Equalizer Simulations," presented at IEEE 802.3ae Equalization on Ad Hoc meeting, Hilton Head, South Carolina, Mar. 11, 2001, 13 pages. cited by other.

Lenosky, Tom, et al., "Measurements of DMD-Challenged Fibers at 1310nm and 1Gb/s Data Rate," presented at IEEE 802.3ae Equalization Ad Hoc meeting, Irvine, California, Jan. 10, 2001, pp. 1-21. cited by other.

Lenosky, Tom, et al., "Measurements of DMD-Challenged Fibers at 850nm and 2Gb/s Data Rate," presented at IEEE 802.3ae Equalization Ad Hoc meeting, Irvine, California, Jan. 10, 2001, pp. 1-21. cited by other.

Liu, Ming-Kang and Modestou, Panayiotis C., "Multilevel Signaling and Pulse Shaping for Spectrum Efficiency in Subcarrier Multiplexing Transmission," Journal of Lightwave Technology, vol. 12, No. 7 (Jul. 1994), pp. 1239-1246. cited by other.

Olshansky, Robert et al., "Subcarrier Multiplexed Coherent Lightwave Systems for Video Distribution," IEEE Journal on Selected Areas in Communications, vol. 8, No. 7 (Sep. 1990), pp. 1268-1275. cited by other.

Olshansky, Robert et al., "Subcarrier Multiplexed Lightwave Systems for Broad-Band Distribution," Journal of Lightwave Technology, vol. 7, No. 9 (Sep. 1989) pp. 1329-1341. cited by other.

Otte, S. and Rosenkranz, W., "A Decision Feedback Equalizer for Dispersion Compensation in High Speed Optical Transmission Systems," IEEE International Conference on Transparent Optical Networks, IEEE, Jun. 1999, pp. 19-22. cited by other.

Parhi, Keshab K., "Parallel Implementation of the DSP Functions of the PAM-5 10Gb/s Transceiver," presented at IEEE 802.3ae 10Gb/s Task Force Plenary week Meeting, Albuquerque, NM, Mar. 7, 2000, 12 pages. cited by other.

Peral, Eva, et al., "Measurements of Time Variation in DMD-Challenged Multimode Fiber at 1310nm for 10GE Equalizer Applications," presented at IEEE 802.3ae Equalization Ad Hoc meeting, Hilton Head, South Carolina, Mar. 11, 2001, 19 pages. cited by other.

Personick S.D., "Receiver Design for Digital Fiber Optic Systems," National Telecommunications Conference, Nov. 26-28, 1973, vol. 1, The Institute of Electrical and Electronics Engineers, Inc., 1973, pp. 8E-1-8E-4. cited by other.

Personick, S.D., "Baseband Linearity and Equalization in Fiber Optic Digital Communication Systems," American Telephone and Telegraph Company, The Bell System Technical Journal, vol. 52, No. 7, Sep. 1973, pp. 1175-1194. cited by other.

Personick, S.D., "Receiver Design for Digital Fiber Optic Communications Systems, I," American Telephone and Telegraph Company, The Bell System Technical Journal, vol. 52, No. 6, Jul.-Aug. 1973, pp. 843-874. cited by other.

Personick, S.D., "Receiver Design for Digital Fiber Optic Systems," National Telecommunications Conference, Nov. 1973, pp. 8E1-8E4. cited by other.

Sidiropoulos, S. and Horowitz, M. A., "A Semidigital Dual Delay-Locked Loop," IEEE Journal of Solid-State Circuits, IEEE, vol. 32, No. 11, Nov. 1997, pp. 1683-1692. cited by other.

Vorenkamp, Pieter, et al., "Analog Interface for 10-Gb/s Ethernet," 13 pages, presented at IEEE 802.3ae 10Gb/s Task Force Plenary week meeting, Albuquerque, NM, Mar. 7, 2000. cited by other.

Winters, G., "Electrical Signal Processing Techniques in Long-Haul, Fiber-Optic Systems," IEEE International Conference on Communications, IEEE, Apr. 1990, pp. 397-403. cited by other.

Winters, Jack H., "Electrical Signal Processing Techniques in Long-Haul Fiber-Optic Systems," IEEE, IEEE Transactions on Communications, vol. 38, No. 9, Sep. 1990, pp. 1439-1453. cited by other.

Winters, Jack H., et al., "Reducing the Effects of Transmission Impairments in Digital Fiber Optic Systems," IEEE, IEEE Communications Magazine, Jun. 1993, pp. 68-76. cited by other.

\* cited by examiner

SNR vs. Fiber Length for FFE, DFE and Viterbi Equalizer

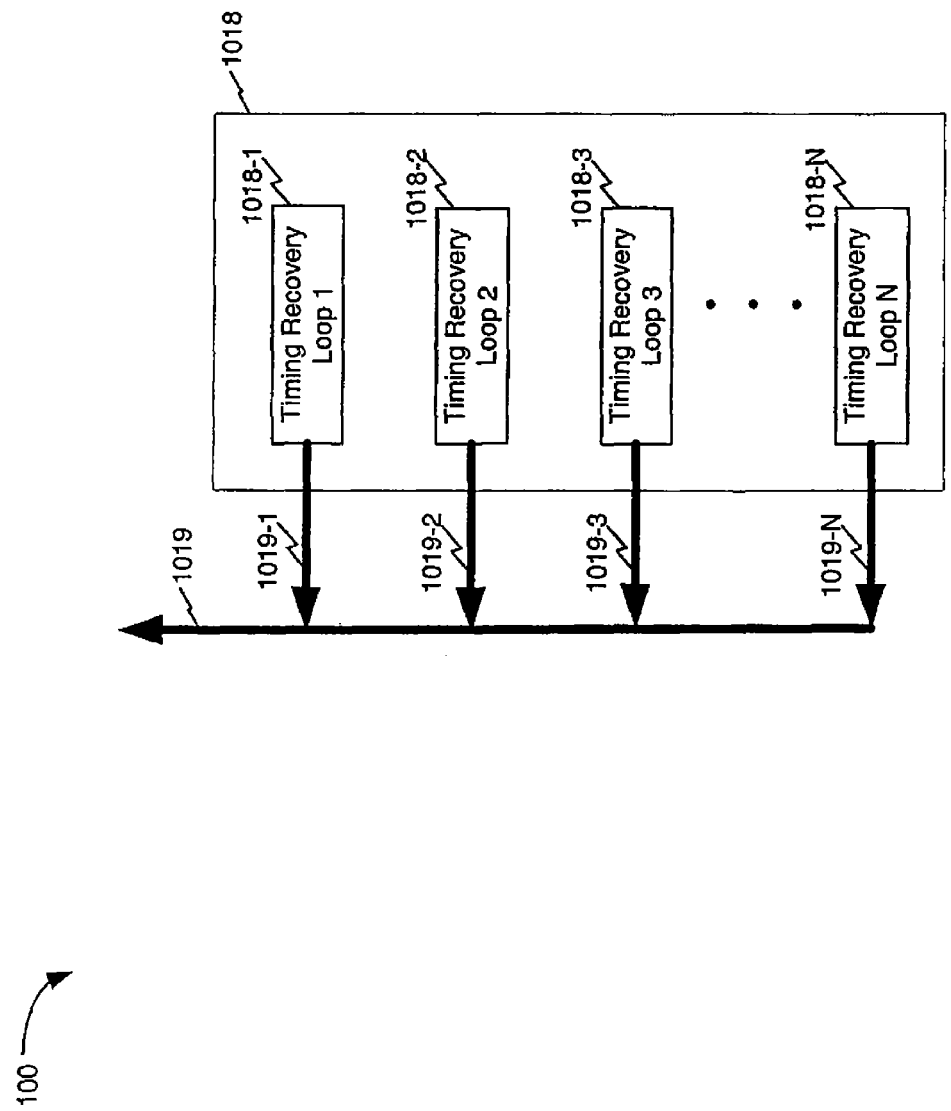

FIG. 18 Timing Recovery

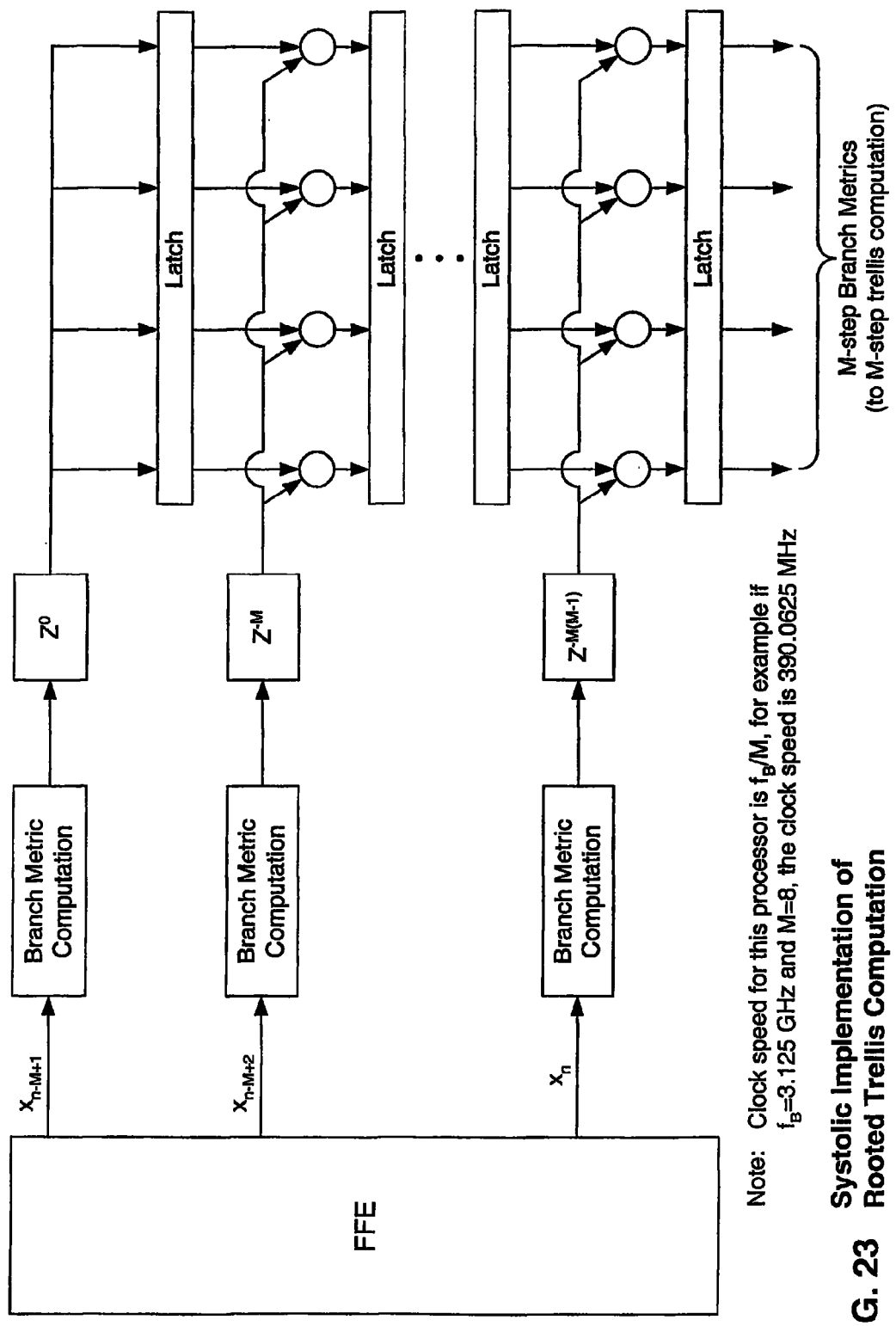
FIG. 23 Systolic Implementation of Rooted Trellis Computation

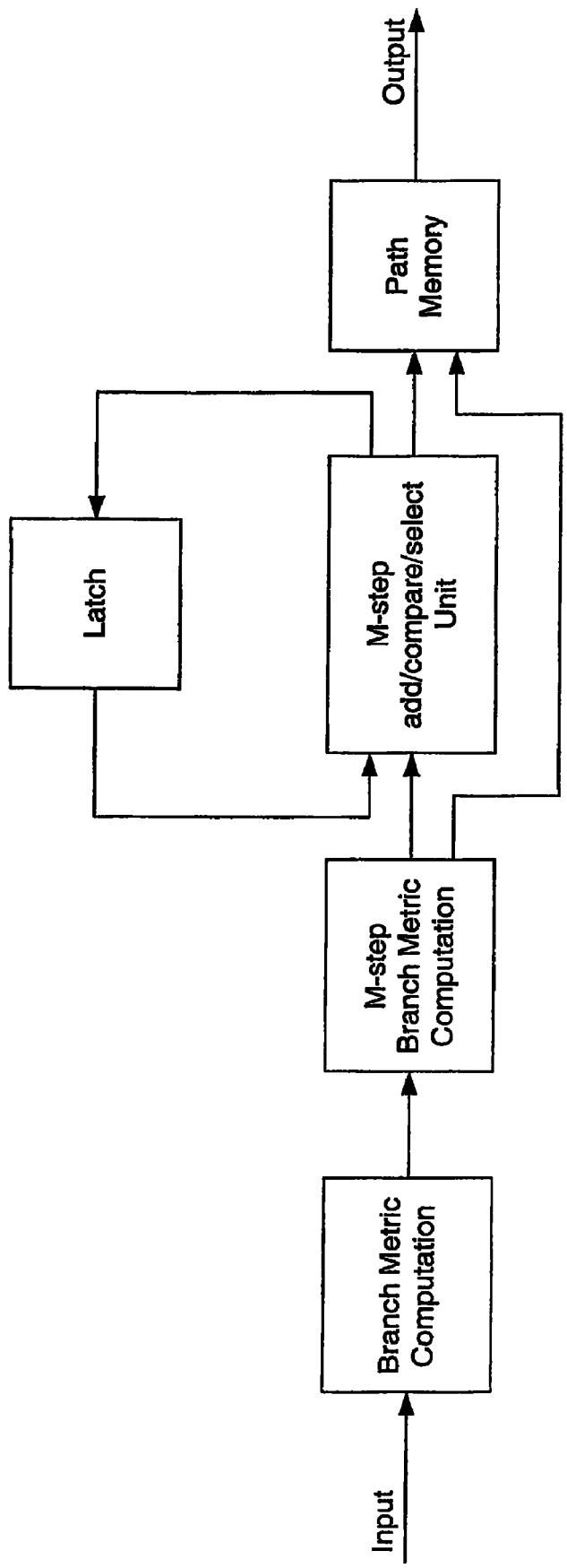
FIG. 24 Overall Block Diagram of Parallel Viterbi Processor

METHODS AND SYSTEMS FOR DIGITALLY PROCESSING DATA SIGNALS

CROSS-REFERENCE TO RELATED APPLICATIONS

This application is a continuation of U.S. application Ser. No. 09/909,896, filed Jul. 23, 2001, now U.S. Pat. No. 7,564,866, which claims priority to U.S. Provisional Application No. 60/219,918, filed Jul. 21, 2000, titled "Wave-Division-Multiplexed Transceiver Using Digital Signal Processing," and U.S. Provisional Application No. 60,273,215, filed Mar. 1, 2001, titled "High-Speed Analog to Digital Conversion System for Communications Applications," which are incorporated herein by reference in their entireties.

BACKGROUND OF THE INVENTION

1. Field of the Invention

The present invention is directed to receivers and, more particularly, to digital signal processing ("DSP") based receivers, electrical receivers, optical receivers, parallel receivers, multi-channel receivers, timing recovery schemes, and without limitation, equalization schemes.

2. Related Art

There is an ever-increasing need for higher speed communications systems. In order to reduce costs, communications systems are increasingly implemented using Very Large Scale Integration (VLSI) techniques. The level of integration of communications systems is constantly increasing to take advantage of advances in integrated circuit manufacturing technology and the resulting cost reductions. This means that communications systems of higher and higher complexity are being implemented in a smaller and smaller number of integrated circuits. For reasons of cost and density of integration, the preferred technology is CMOS.

Digital Signal Processing ("DSP") techniques generally allow higher levels of complexity and easier scaling to finer geometry technologies than analog techniques, as well as superior testability and manufacturability. However, DSP based communications systems require for their implementation an analog-to-digital converter ("ADC"). In many applications, the ADC is challenging to design. In the extreme, the ADC requirements sometimes limit the practicality of building DSP-based communications systems. One such case occurs when the speed of the communication system is very high, for example in the gigabit per second range.

There is growing demand for communications systems that operate at data rates in the gigabit per second range. Examples of such systems are transceivers for optical communications for standards such as OC-48, OC-192, and OC-768, 10 gigabit Ethernet, Fibre Channel, etc. Another example is a transmission system where the communication channel is a microstrip delay line on a printed circuit ("PC") board. These communications systems typically operate over short distances and they are used to interconnect chips on a PC board or on different PC boards across a back plane in a rack-based system. These systems typically operate at data rates of several gigabits per second, and there is a need to increase the speed to the limits allowed by the technology. Additional examples could be found in transmission systems operating over short lengths of coaxial, twisted pair, or twin-ax cable.

Data signals are affected by various types of impairments, such as intersymbol interference. These impairments get progressively worse at higher data rates. Therefore, there is a need for methods and systems for compensate for intersymbol interference, to facilitate higher rate of data transmissions.

BRIEF SUMMARY OF THE INVENTION

The present invention is directed to receivers and, more particularly, to digital signal processing ("DSP") based receivers, electrical receivers, optical receivers, parallel receivers, multi-channel receivers, coding and error correcting schemes, timing recovery schemes, and, without limitation, equalization schemes.

In an embodiment, the present invention is implemented as a receiver that receives one or more electrical data signals. Alternatively, or additionally, the present invention is implemented as an optical receiver that receives one or more optical signals.

In an embodiment, the present invention is implemented as a single path receiver. Alternatively, the present invention is implemented as a multi-path parallel receiver in which an analog-to-digital converter ("ADC") and/or a digital signal processor ("DSP") are implemented with parallel paths that operate at lower rates than the received data signal.

In an embodiment, a parallel DSP-based receiver in accordance with the invention includes a separate timing recovery loop for each ADC path. The separate timing recovery loops can be used compensate for timing phase errors in the clock generation circuit that are different for each path. In an embodiment, a parallel DSP-based receiver in accordance with the invention includes a separate automatic gain control (AGC) loop for each ADC path. The separate AGC loops can be used to compensate for gain errors on a path-by-path basis. In an embodiment, a parallel DSP-based receiver in accordance with the invention includes a separate offset compensation loop for each ADC path. The separate offset compensation loops can be used to independently compensate for offsets that are different for each path.

In an embodiment the present invention is implemented as a multi-channel receiver that receives a plurality of data signals.

In an embodiment, a receiver in accordance with the present invention performs DSP-based equalization on electrical data signals and/or on electrical representations of optical data signals. In accordance with aspects of the invention, equalization is performed in single path receivers and parallel multi-path receivers, on electrical data signals and/or optical data signals.

In accordance with aspects of the invention, one or more of the following types of equalization are performed, alone and/or in various combinations with one another:

Viterbi equalization;
feed-forward equalization ("FFE"); and/or
decision feed-back equalization ("DFE").

For example, in an embodiment, Viterbi equalization and FFE are performed in a parallel DSP-based receiver. In an embodiment, Viterbi equalization and DFE are performed in a parallel DSP-based receiver. In an embodiment, FFE and DFE are performed in a parallel DSP-based receiver. The invention is not, however, limited to these example implementations.

In an embodiment, one or more aspects of the present invention are utilized to perform equalization of modal dispersion (also known as multi-mode dispersion or differential mode delay (DMD)) in multi-mode optical fibers.

In an embodiment, one or more aspects of the present invention are utilized to perform equalization of waveguide and/or chromatic dispersion in optical fibers.

In an embodiment, one or more aspects of the present invention are utilized to perform equalization of polarization-mode dispersion in optical fibers.

In an embodiment, one or more aspects of the present invention are utilized to perform equalization of dispersion caused by laser chirping in optical fibers In many optical communications systems, external modulators, such as Lithium Niobate modulators and/or Electro-absorption modulators are used to reduce the detrimental effects of laser chirping. The most important detrimental effect of laser chirping is an increase of the dispersion experienced by the optical signal as it propagates along the optical fiber. In an embodiment, one or more aspects of the present invention are utilized to perform equalization of the additional dispersion caused by chirping when external modulators are not used. The importance of this aspect of the invention resides in the fact that external modulators can then be eliminated and traditional intensity modulation of the laser can be used instead. This results in a major cost reduction for the optical communication system. Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

The drawing in which an element first appears is typically indicated by the leftmost digit(s) in the corresponding reference number.

BRIEF DESCRIPTION OF THE FIGURES

The present invention will be described with reference to the accompanying drawings wherein:

FIG. 10C is a block diagram of individual timing recovery loops that can be implemented for the N ADC paths illustrated in FIG. 10A;

FIG. 23 illustrates an example systolic implementation of rooted trellis computation, in accordance with an aspect the present invention; and FIG. 24 is a high-level block diagram of an example parallel Viterbi processor in accordance with an aspect of the present invention.

DETAILED DESCRIPTION OF THE INVENTION

Table Of Contents

I. Introduction
   A. Receivers and Transceivers
   B. Optical Receivers
   C. Equalization
II. High Speed, DSP-Based Receiver
   A. Parallel ADC and DSP
III. Design and Control Considerations
   A. Path-Based Timing Recovery and Phase Error Compensation
      1. DAC-Based Phase Interpolator
      2. Resistive Interpolation Ring
   B. Gain and Offset Mismatch Compensation
      1. DSP-Based Adaptive Path Gain and Offset Mismatch Control
      2. Automatic Gain Control (AGC)
      3. Analog Compensation
      4. Alternative Implementations
IV. Parallel Equalization
   A. Parallelization of the Viterbi Decoder
   B. Example System Implementations
V. Error Correction
VI. Conclusions

I. INTRODUCTION

A. Receivers and Transceivers

The present invention is directed to receivers and, more particularly, to digital signal processing ("DSP") based receivers, optical receivers, multi-channel receivers, timing recovery schemes, and, without limitation, equalization schemes. Various features in accordance with the present invention are described herein. The various features can generally be implemented alone and/or in various combinations with one another. Example implementations of various combinations of features of the invention are provided herein. The invention is not, however, limited to these examples. Based on the description herein, one skilled in the relevant art(s) will understand that the features described herein can be practiced alone and or in other combinations as well.

Figure 1A:
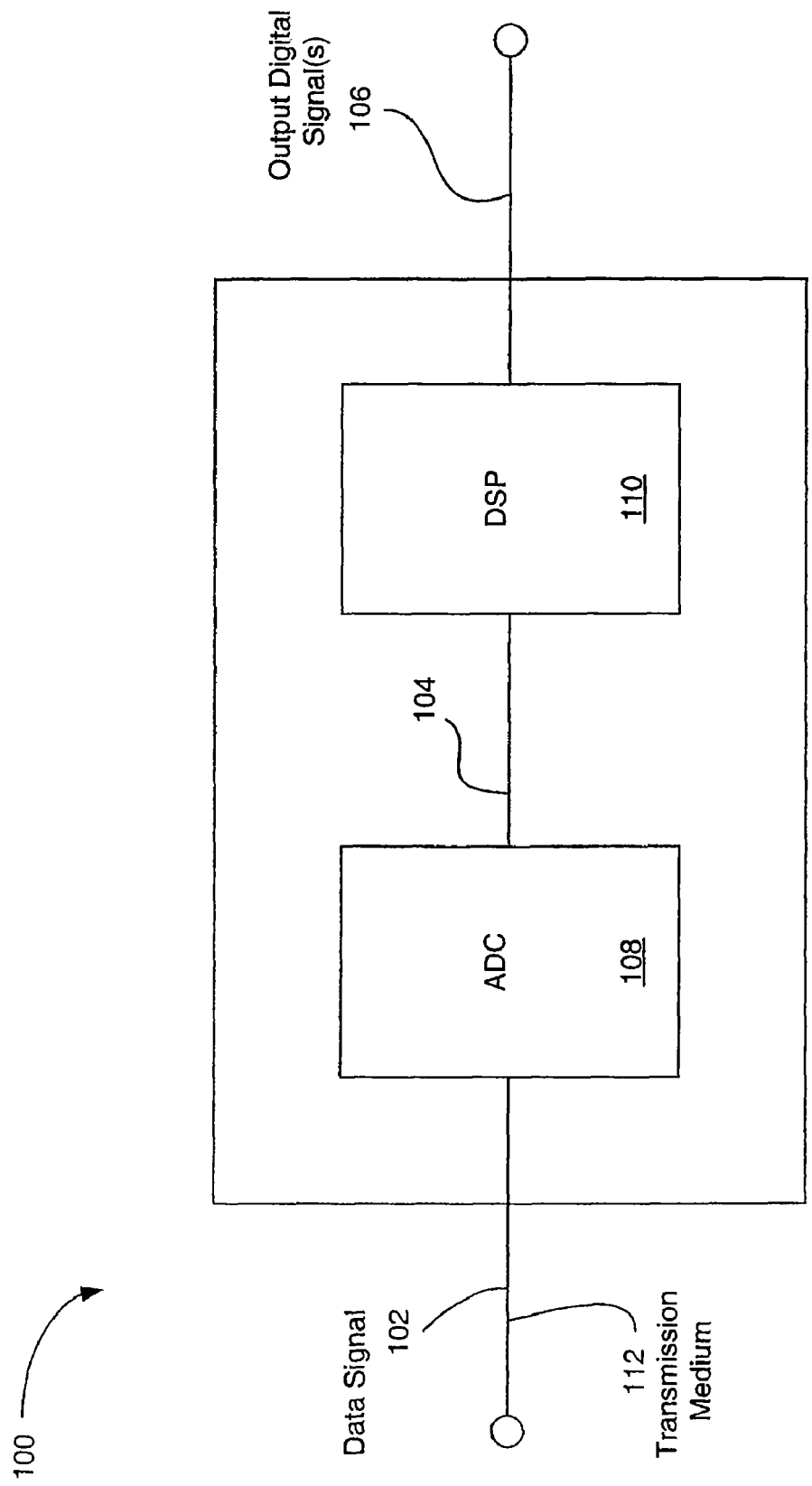
FIG. 1A is a high level block diagram of a DSP-based receiver, in accordance with an aspect of the present invention.

FIG. 1A is a high-level block diagram of an example DSP-based receiver 100, in accordance with the present invention. The DSP-based receiver 100 receives a data signal 102 through a transmission medium 112 and converts it to a digital data signal 106.

In an embodiment, the DSP-based receiver 100 is configured to receive an electrical data signal 102. In an alternative embodiment, the DSP-based receiver 100 is configured to receive an optical data signal 102. The later embodiment is described below with respect to FIG. 1B.

In FIG. 1A, the DSP-based receiver 100 includes an analog-to-digital converter ("ADC") 108 that digitizes the data signal 102 and outputs one or more internal digital signals 104. The DSP-based receiver 100 also includes a DSP 110 that performs one or more digital signal processes on the one or more digital signals 104, and outputs one or more digital output signals 106.

DSP processes in accordance with the present invention are described below, including, without limitation, equalization, error correction (such as hard or soft decoding of, without limitation, convolutional, trellis, or block codes), timing recovery, automatic gain control, and offset compensation. Analog circuitry (not shown in FIG. 1A) is optionally provided to perform portions of one or more of these functions.

In an embodiment, the ADC 108 and/or the DSP 110 are implemented with multiple parallel paths, wherein each parallel path operates at a lower speed relative to the data signal 102. In an embodiment, the parallel paths are operated in an interleaved fashion as described below. In an embodiment, the ADC 108 is configured with N parallel paths and the DSP 110 is configured with M parallel paths, where M=kN, wherein k is an integer. In parallel implementations, one or more DSP and/or analog processes, including, without limitation, one or more compensation processes, can be performed on a per path basis, as described below.

In an embodiment, the transmission media 112 carries a plurality of data signals 102, wherein a separate DSP-based receiver 100 is provided for each data signal 102.

B. Optical Receivers

Figure 1B:
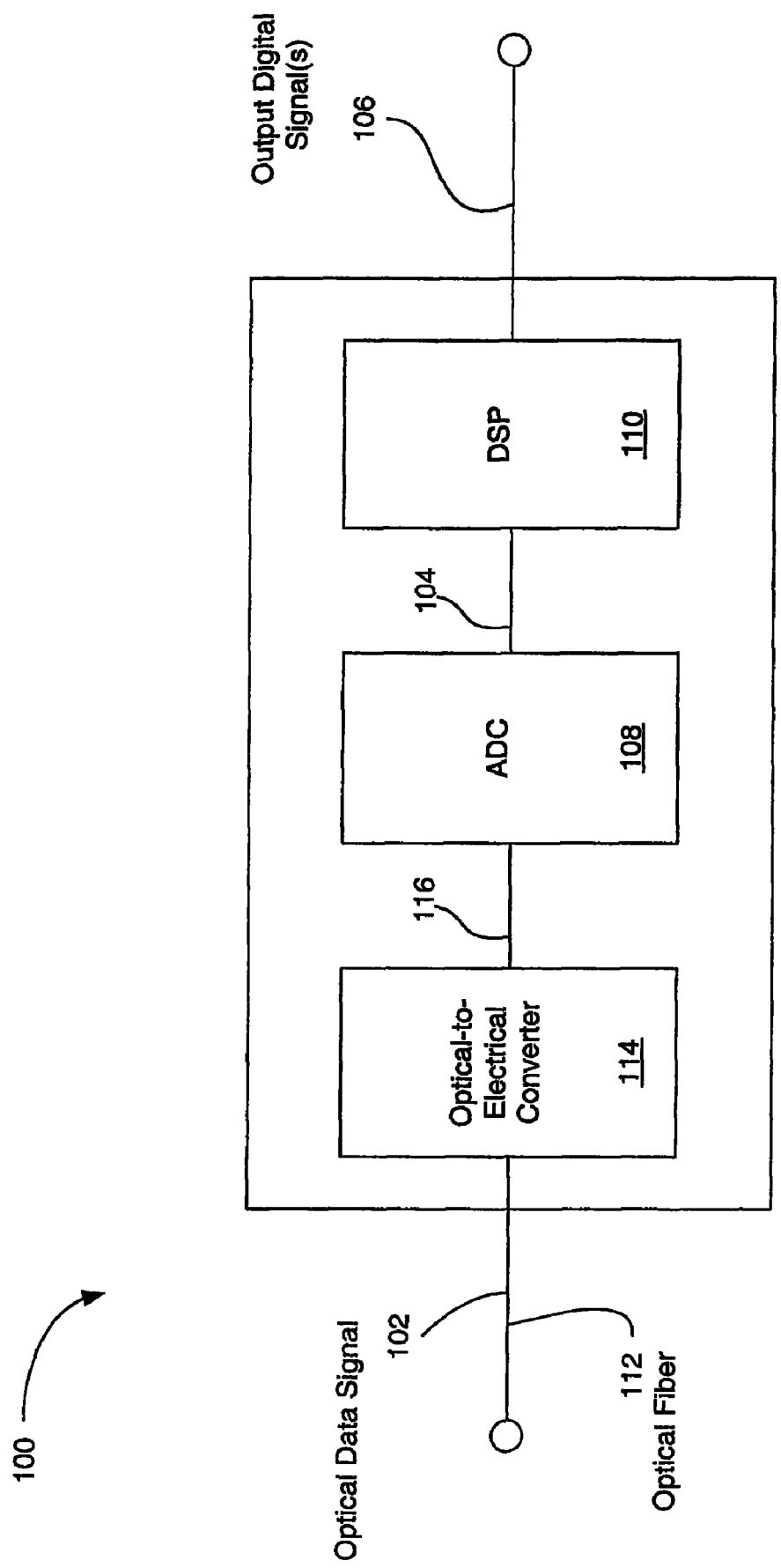
FIG. 1B is a high level block diagram of an optical DSP-based receiver, in accordance with an aspect of the present invention.

In an embodiment, a receiver in accordance with the present invention receives one or more optical signals from an optical transmission medium such as, without limitation, fiber optic cable. For example, FIG. 1B is a block diagram of the example DSP-based receiver 100, implemented as an optical DSP-based receiver 100, in accordance with an aspect of the present invention. In this implementation, the data signal 102 is an optical data signal 102 and the transmission medium 112 is an optical fiber 112. In this implementation, the optical DSP-based receiver 100 includes an optical-to-electrical converter 114 that converts the optical data signal 102 to an electrical representation 116 of the optical data signal 102.

Figure 1C:
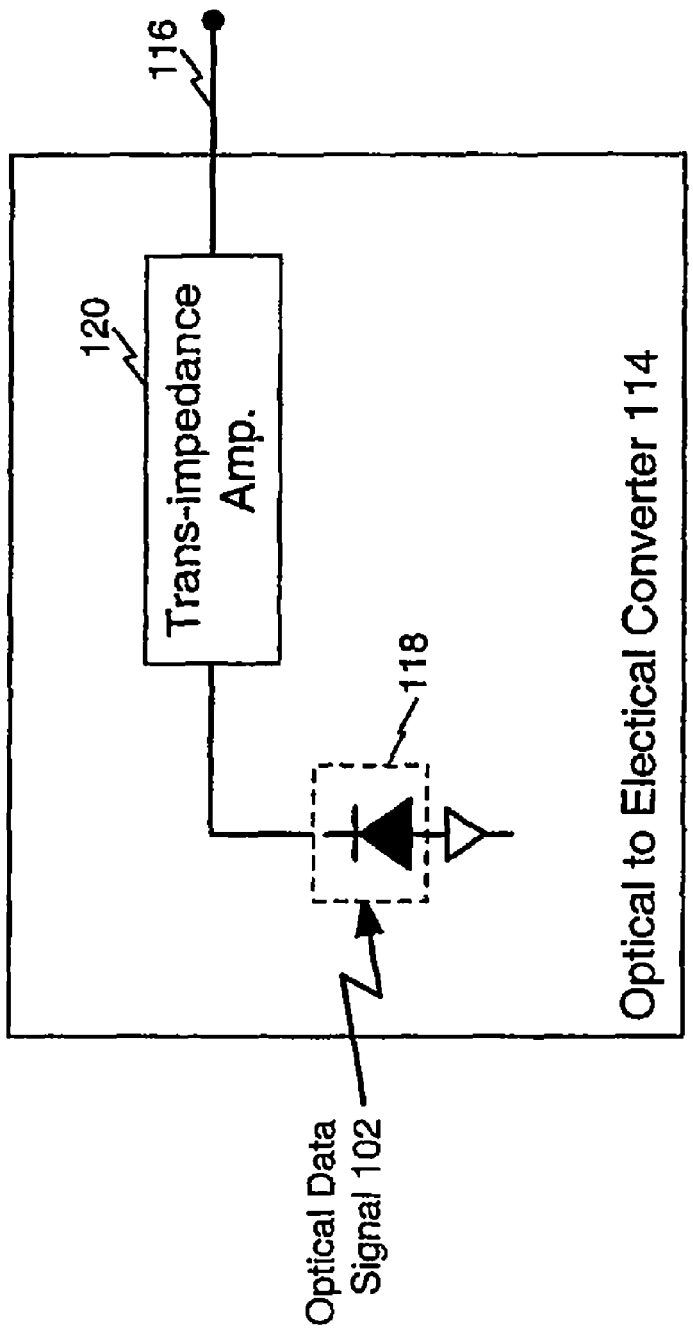
FIG. 1C is a block diagram of an example implementation of the optical to electrical converter illustrated in FIG. 1B.

FIG. 1C illustrates an example implementation of the optical-to-electrical converter 114, including a photo detector 118 that converts the optical data signal 102 to the electrical representation 116. The optical-to-electrical converter 114 is further illustrated with a trans-impedance amplifier 120. Optical receivers in accordance with the invention are not, however, limited to the example illustrated in FIG. 1C.

The DSP 110 illustrated in FIG. 1B performs one or more digital signal processes on the electrical representation 116 of the optical data signal 102. DSP processes in accordance with the present invention are described below, including, without limitation, equalization, error correction (such as, without limitation, hard or soft decoding of convolutional, trellis, or block codes), timing recovery, automatic gain control, and offset compensation. Analog circuitry (not shown in FIG. 1B) is optionally provided to perform portions of one or more of these features.

The optical DSP-based receiver 100 illustrated in FIG. 1B can be implemented as a single path receiver or a parallel multi-path receiver as described above with respect to FIG. 1A. In parallel implementations, one or more DSP and/or analog processes, including, without limitation, one or more compensation processes, can be performed on a per path basis. Parallel implementations of the invention are described below.

In an embodiment, an optical receiver in accordance with the present invention receives a single wavelength optical signal from the fiber optic cable 102. The single wavelength can be received from a single mode fiber or a multi-mode fiber. Alternatively, an optical receiver in accordance with the present invention receives multiple wavelengths that are multiplexed on the fiber optic cable 102.

For example, in an embodiment, the plurality of optical signals is wave-division-multiplexed ("WDM") and transmitted through an optic fiber by modulating (e.g., intensity modulating) each signal at a different wavelength. WDM optical signals include, without limitation, coarse wavelength division multiplexed (CWDM) optical signals, wide-spacing wavelength division multiplexed (WWDM) signals, and dense wavelength division multiplexed (DWDM) optical signals. DWDM optical signals are relatively close to one another, typically less than 1 nm.

The terms CWDM and WWDM are often used synonymously with one another. CWDM and WWDM signals are typically spaced relatively far apart, for example, 20 nm separation. Under the IEEE 802.3ae Task Force, the term CWDM has been used to refer to short wavelength (e.g., 850 nm) systems, having four wavelengths approximately 20 nm apart, all in the neighborhood of 850 nm. WWDM has been applied to longer wavelength systems. For example, optical signals in the vicinity of 1310 nm. As used herein, however, the acronyms CWDM and WWDM are not necessarily limited to these definitions. Multi-wavelength implementations of the present invention are not limited to WDM, CWDM, WWDM, or DWDM optical signals.

In a multi-wavelength embodiment, a plurality of DSP-based receivers 100 is provided, one for each of the plurality of data signals 102. Prior to the plurality of DSP-based receivers 100, a demultiplexer (not shown in FIG. 1B or 1C) separates the plurality of optical data signals 102 and provides each to a respective one of the plurality of DSP-based receivers 100.

Figure 9:
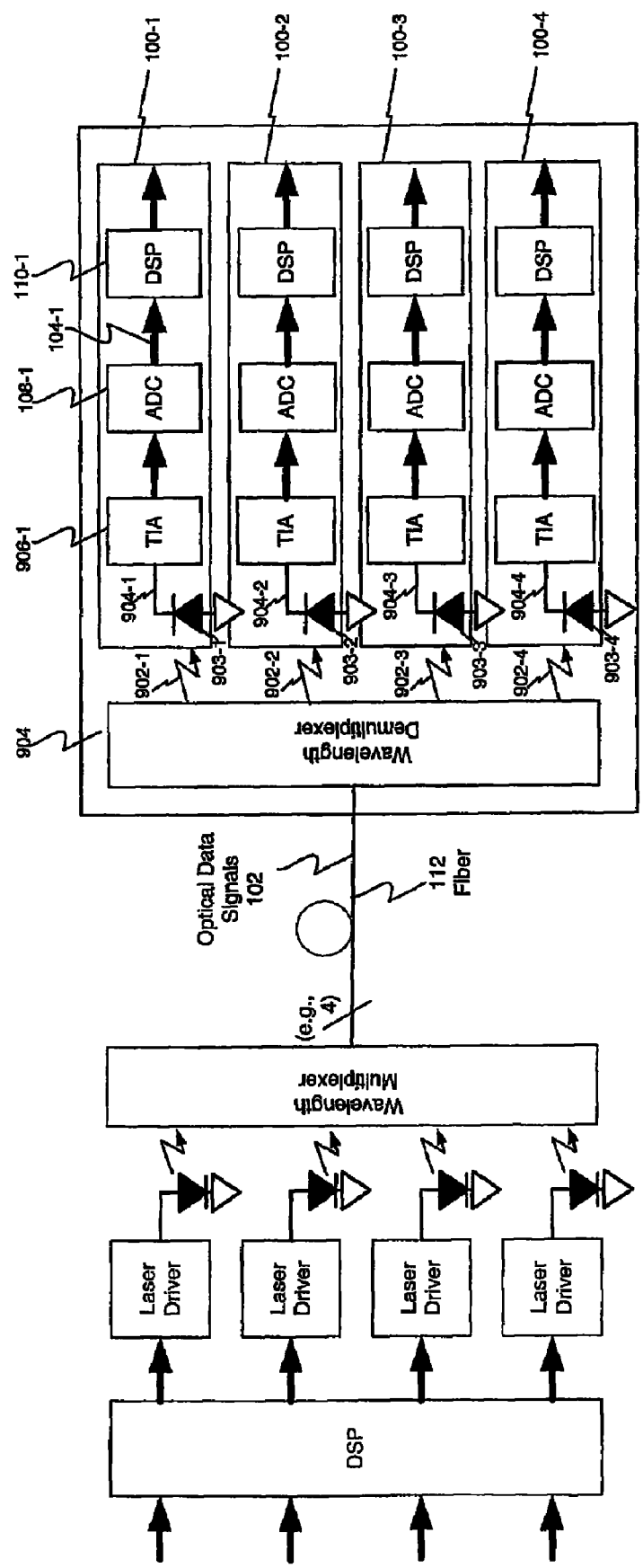
FIG. 9 illustrates an example implementation of the invention.

FIG. 9 illustrates an example multiple wavelength receiver implementation of the present invention, wherein the optical data signal 102 includes four optical data signals 902-1 through 902-4. In other embodiments, more or less than four optical data signal can be used. The four optical data signals 902-1 through 902-4 are demultiplexed in a wavelength division demultiplexer 904. The four optical data signals 902-1 through 902-4 are converted to electrical data signals 904-1 through 904-4 by optical-to-electrical converters 903-1 through 903-4, respectively, and amplified by trans-impedance amplifiers 906-1 through 906-4, respectively. Each of the electrical data signals 904-1 through 904-4 are then provided to respective receivers 100-1 through 100-4, where they are converted to digital signals by the respective ADCs, and demodulated and decoded in the respective DSPs, in accordance with the invention.

C. Equalization

Equalization of electrical data signals and electrical representations of optical signals are now described with respect to FIGS. 1A and 1B. During operation of the DSP-based receiver 100, the data signal 102 is received by the receiver 100 through the transmission medium 112. During transmission through the transmission medium 112, the data signal 102 is typically impaired, due to inter-symbol interference and noise. Inter-symbol interference and noise are typically a function of, among other things, physical properties and the length of the transmission medium 112. Inter-symbol interference and noise are said to reduce the "eye opening" of the data signal 102, making it more difficult to accurately process the data signal 102.

In an embodiment, the receiver 100 of FIG. 1A and/or FIG. 1B includes one or more equalizers (not shown in FIGS. 1A and 1B), which may include, without limitation, linear equalizers and/or non-linear equalizers. The one or more equalizers improve the "eye opening" of the data signal 102. The present invention provides parallel and non-parallel equalization embodiments.

In an embodiment the one or more equalizers perform one or more of the following types of equalization:
  feed forward equalization ("FFE");
  Viterbi equalization; and/or
  decision feedback equalization ("DFE").

In accordance with an aspect of the invention, equalization, including linear and/or non-linear equalization, is performed in a receiver that receives an electrical data signal. In accordance with another aspect of the invention, equalization, including linear and/or non-linear equalization, is performed in a receiver that receives an optical data signal.

In an embodiment, equalization is implemented in a single path receiver. Any of a variety of conventional implementation techniques, or combinations thereof, can be implemented in an electrical and/or optical single path receiver.

In an embodiment, equalization is implemented in a parallel multi-path receiver.

In an embodiment, error correction such as, without limitation, hard or soft decoding of convolutional, trellis, or block codes is implemented in an electrical and/or optical single path receiver.

In an embodiment, error correction such as, without limitation, hard or soft decoding of convolutional, trellis, or block codes is implemented in an electrical and/or optical multi-path receiver.

Figure 10A:
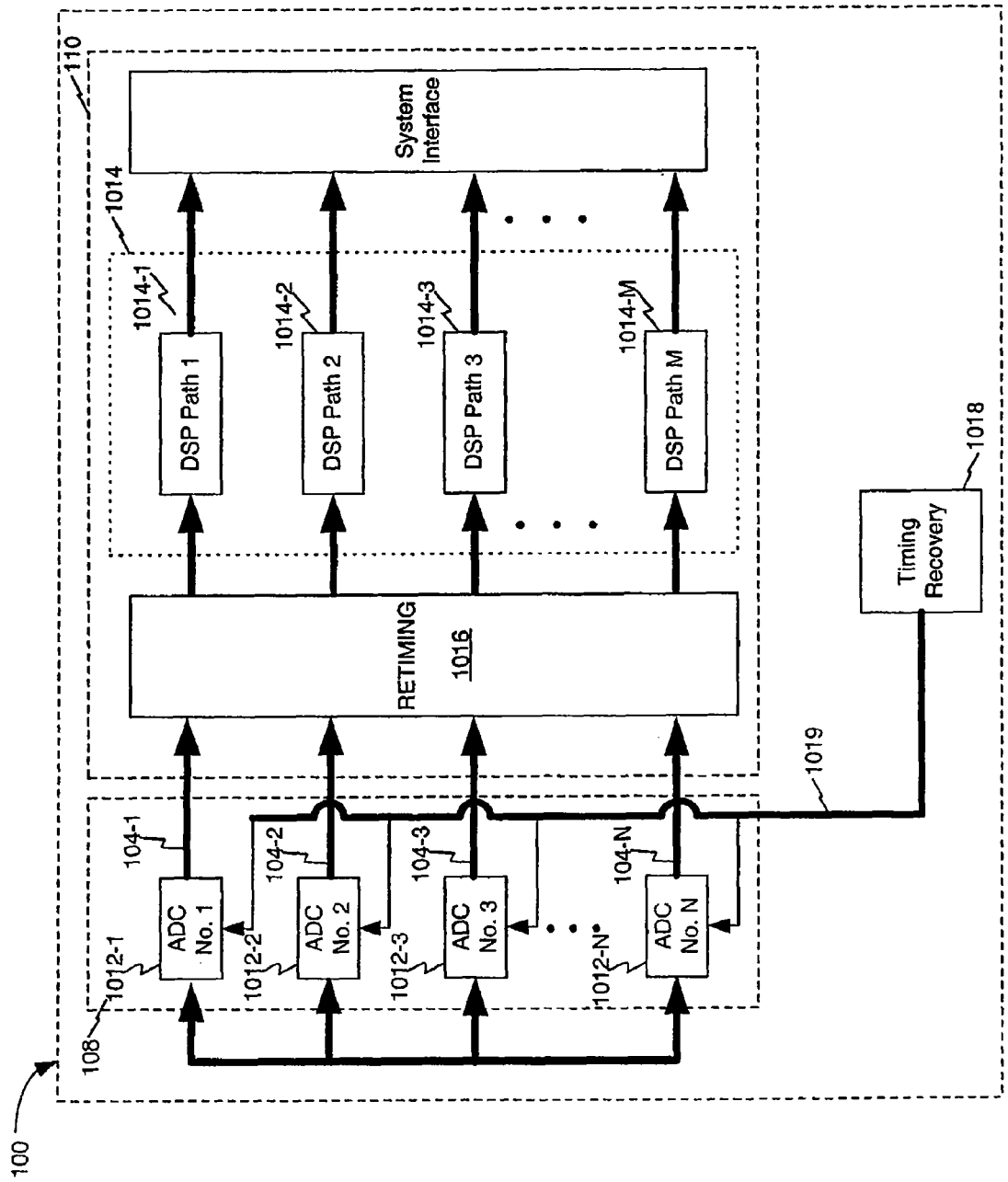
FIG. 10A is a block diagram of an example parallel receiver, including an N-path ADC and an M-path DSP, in accordance with an aspect of the invention.
Figure 10B:
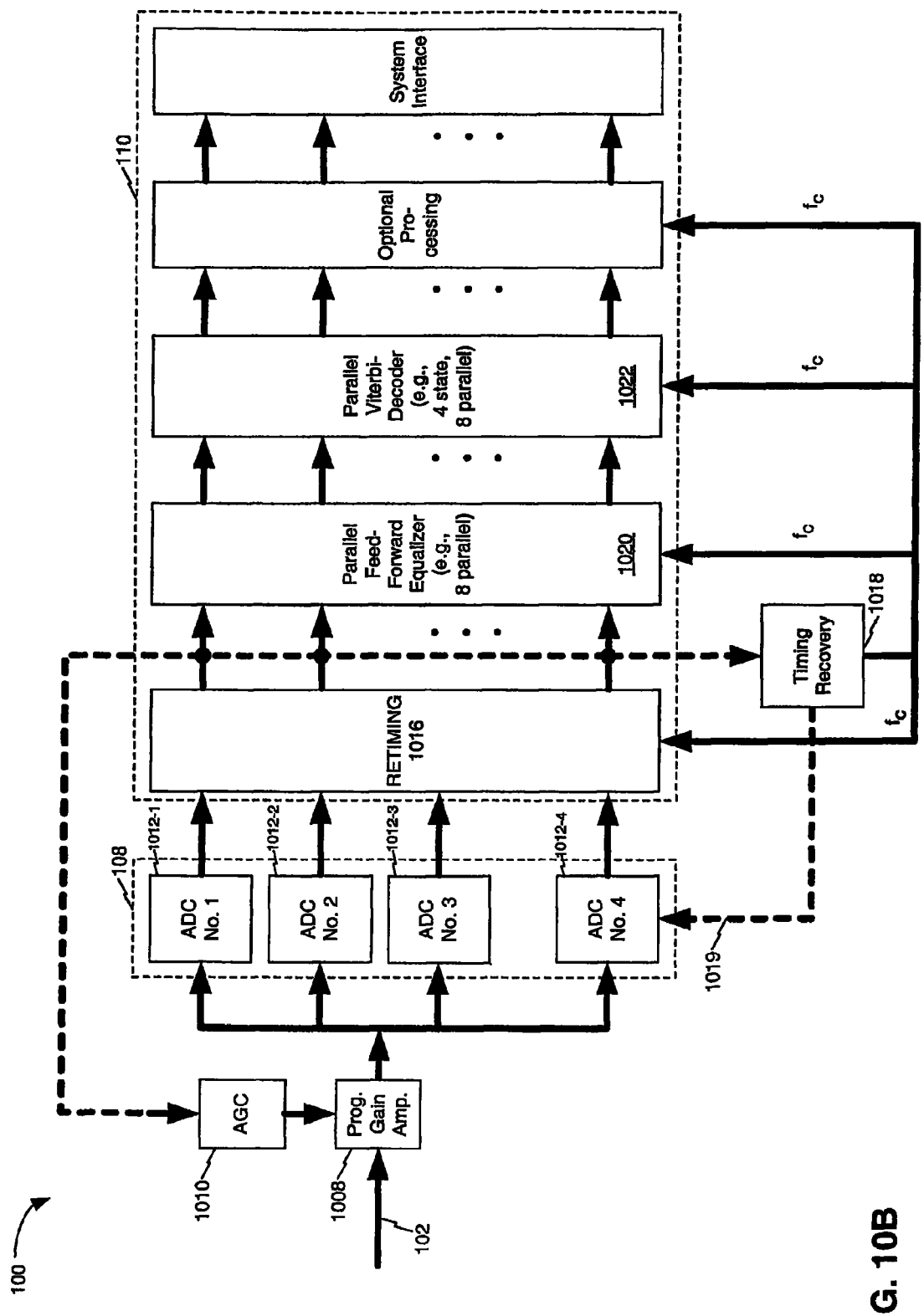
FIG. 10B is a block diagram of an example implementation of the parallel receiver illustrated in FIG. 10A.

Example implementations in accordance with aspects of the invention are described below. Any of a variety of conventional parallel implementation techniques and/or new techniques in accordance with the invention, or combinations thereof, can be implemented in an electrical and/or optical parallel multi-path receiver. It is important not to confuse the concept of "multi-path receiver" with the concept of multiple receivers operating concurrently, such as in the case of a WDM optical channel. In the context of this disclosure, "multi-path receiver" refers to a receiver where a single input data signal is digitized by an array of interleaved ADCs and/or processed by a digital signal processor using a parallel implementation, as shown in FIGS. 10A and 10B. In the example of a WDM receiver shown in FIG. 9, each wavelength requires a separate receiver, and each one of these receivers could be a multi-path receiver such as the one shown in FIGS. 10A and 10B.

Example implementations of equalization performed on optical signals are now provided. The examples below refer to the digital signals 104 in FIG. 1B, which are a digital representation of the electrical representation 116 of the optical data signal 102.

Figure 2:
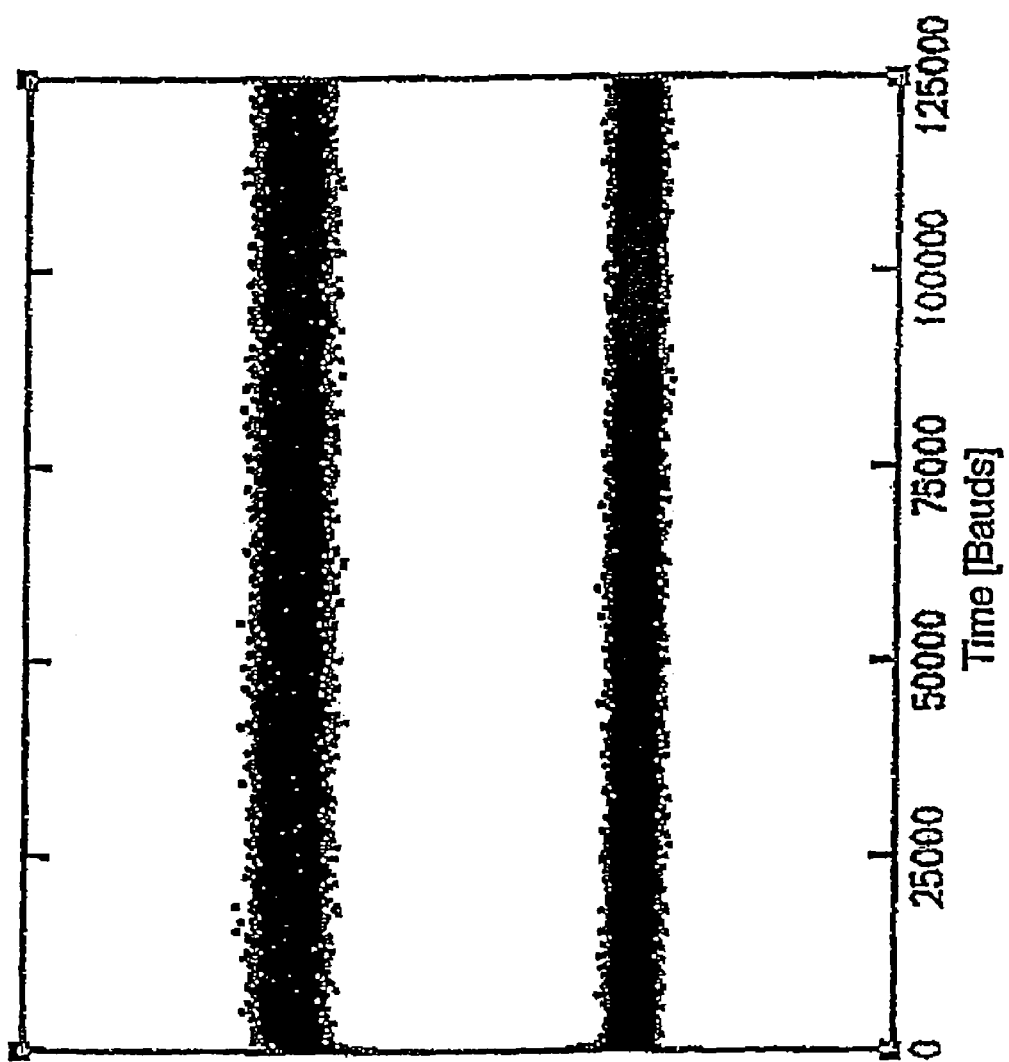
FIG. 2 is an eye diagram of a digital signal after feed forward equalization, in accordance with an aspect of the present invention, wherein a corresponding optical signal traveled through 400 meters of multi-mode optical fiber.
Figure 3:
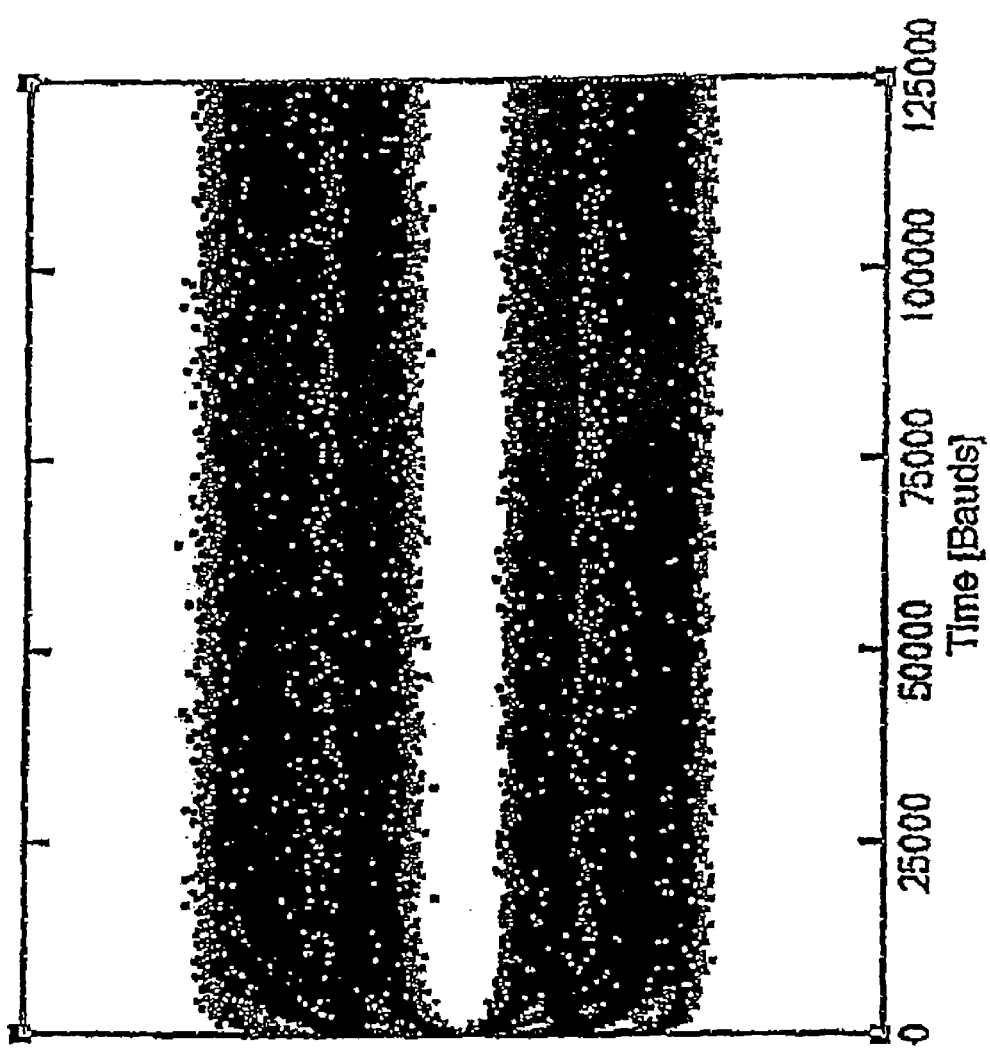
FIG. 3 is an eye diagram of a digital signal after feed forward equalization, in accordance with an aspect of the present invention, wherein the corresponding optical signal traveled through 600 meters of multi-mode optical fiber.

FIG. 2 is an eye diagram of the digital signal 106 after the FFE, wherein the corresponding optical signal 102 traveled through 400 meters of multi-mode optical fiber (i.e., transmission medium 112 is 400 meters of multi-mode optical fiber). FIG. 3 is an eye diagram of the digital signal 106 after the FFE, wherein the corresponding optical signal 102 traveled through 600 meters of multi-mode optical fiber (i.e., transmission medium 112 is 600 meters of multi-mode optical fiber).

Figure 4:
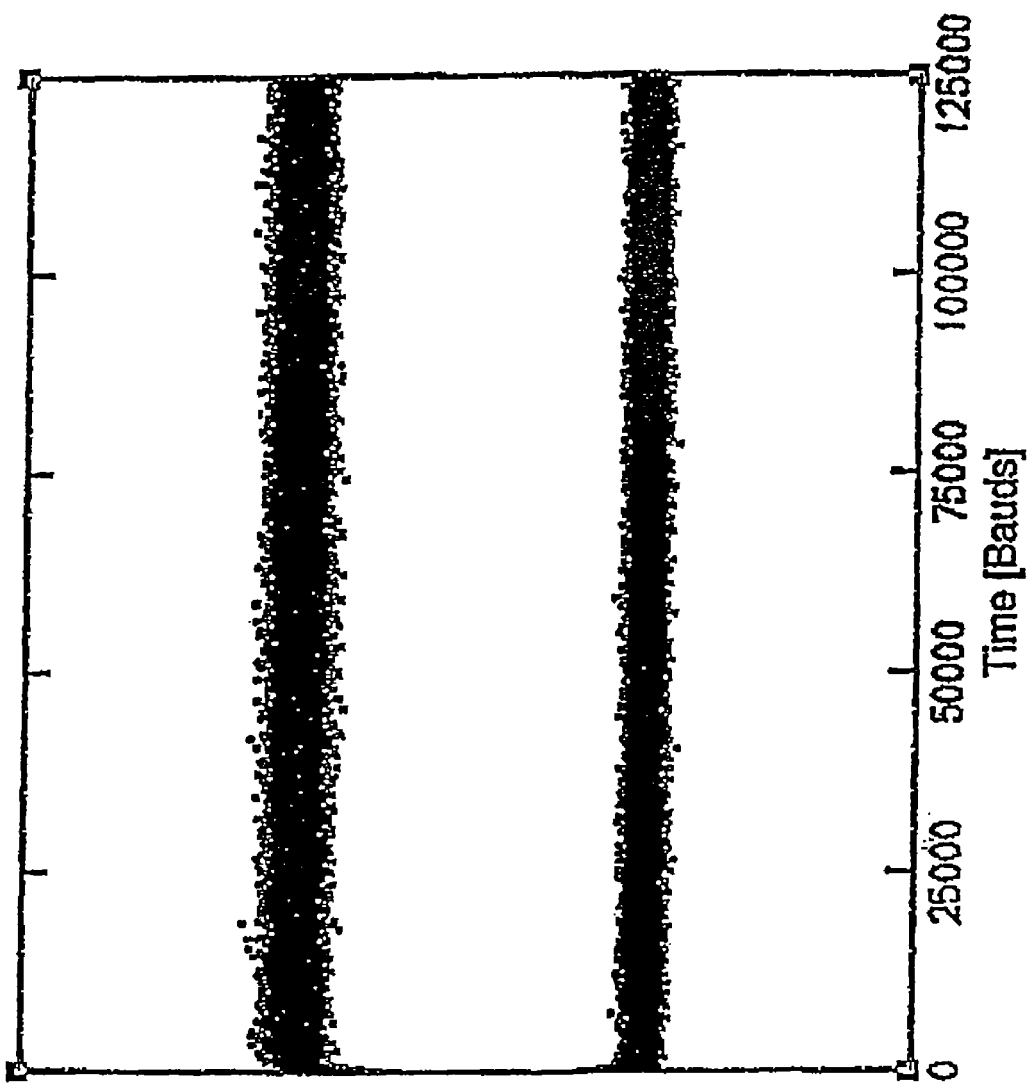
FIG. 4 is an eye diagram of a digital signal after decision feedback equalization, in accordance with an aspect of the present invention, wherein the corresponding optical signal traveled through 400 meters of multi-mode optical fiber.
Figure 5:
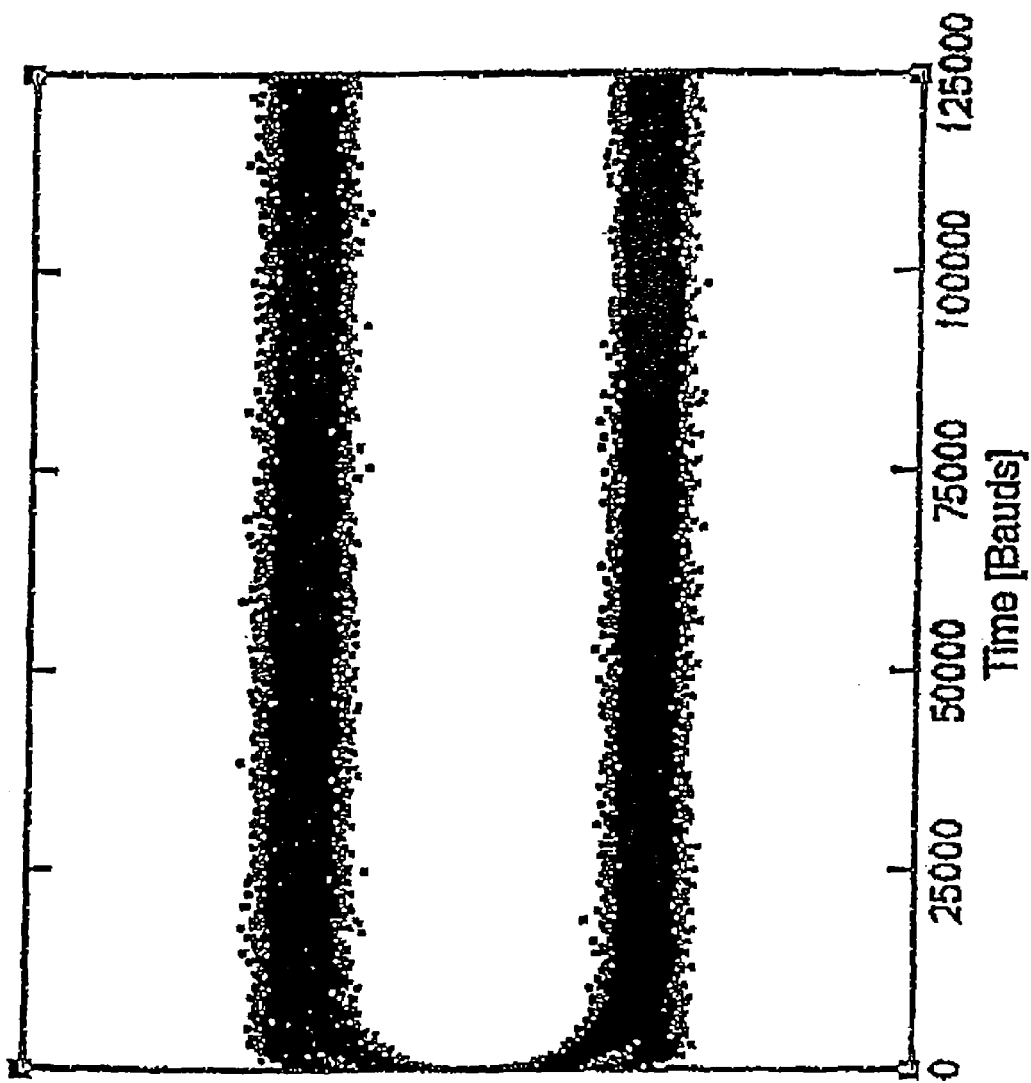
FIG. 5 is an eye diagram of a digital signal after decision feedback equalization, in accordance with an aspect of the present invention, wherein the corresponding optical signal traveled through 600 meters of multi-mode optical fiber.

FIG. 4 is an eye diagram of the digital signal 106 after the DFE, wherein the corresponding optical signal 102 traveled through 400 meters of multi-mode optical fiber (i.e., transmission medium 112 is 400 meters of multi-mode optical fiber). FIG. 5 is an eye diagram of the digital signal 106 after the DFE, wherein the corresponding optical signal 102 traveled through 600 meters of multi-mode optical fiber (i.e., transmission medium 112 is 600 meters of multi-mode optical fiber).

In an embodiment, the one or more equalizers perform a combination of FFE and Viterbi equalization.

Figure 6:
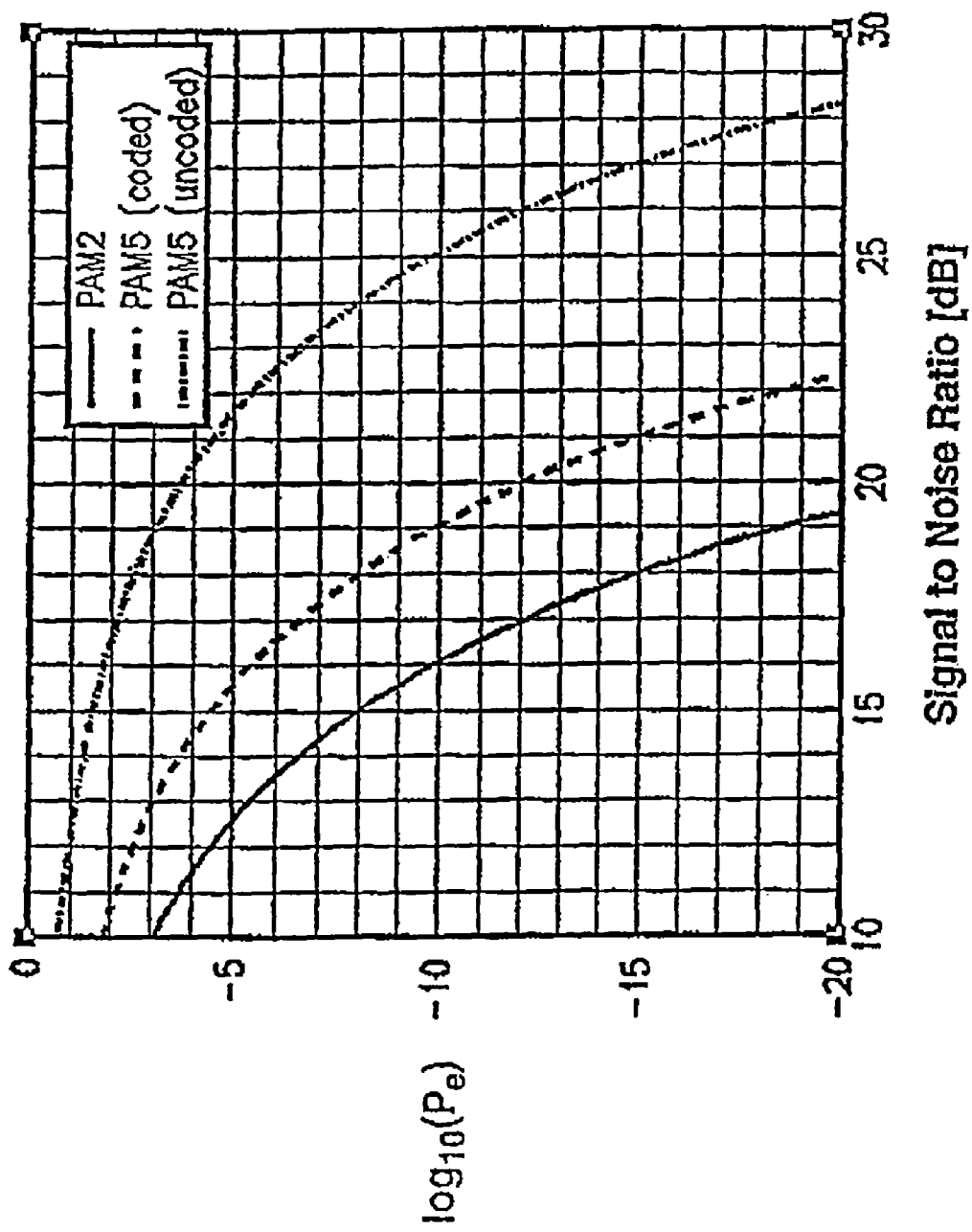
FIG. 6 is a chart illustrating bit error rate versus signal to noise ratio ("SNR") for various types of data encoding.
Figure 7:
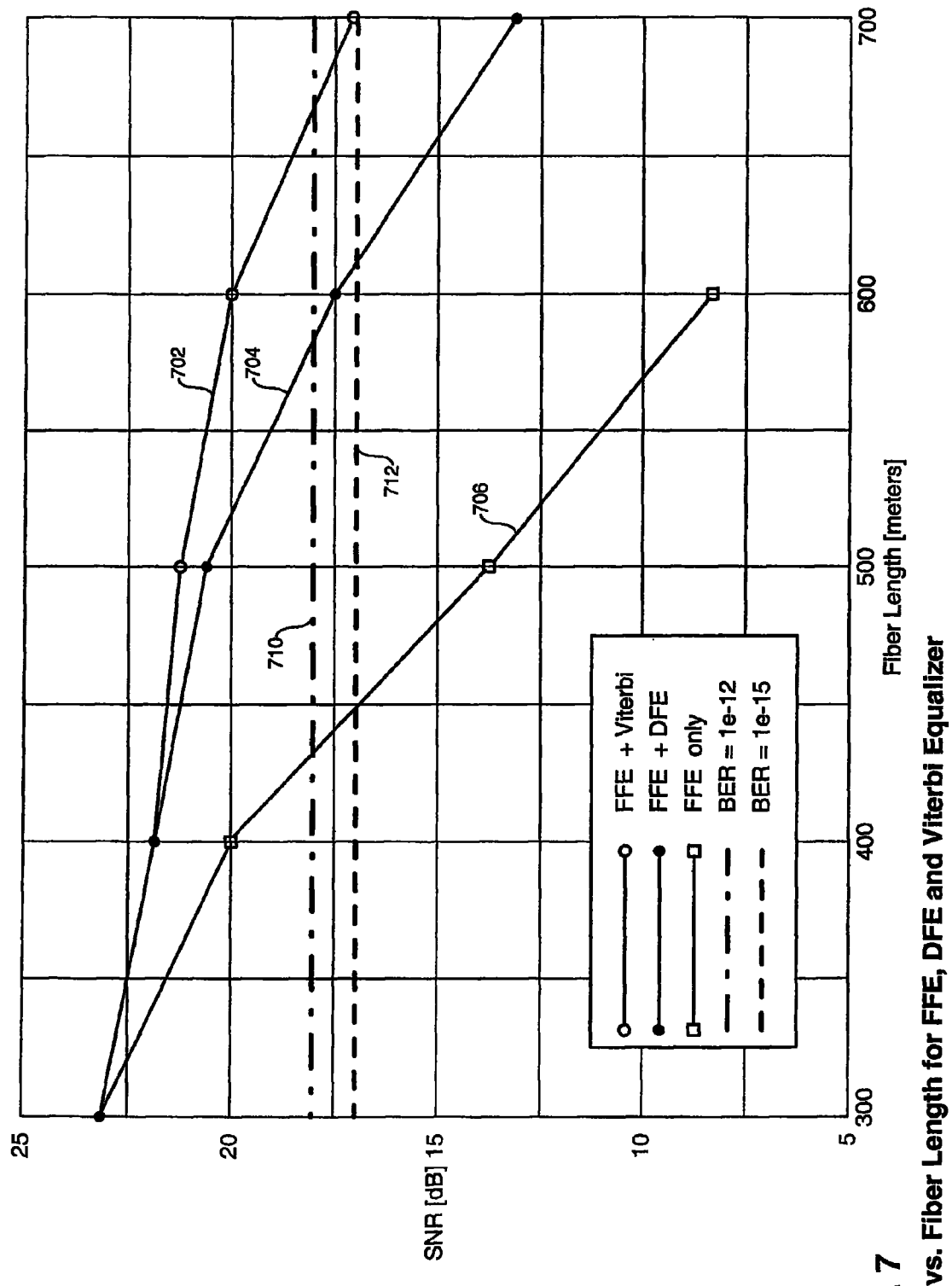
FIG. 7 is a chart illustrating SNR versus length of multi-mode fiber for various implementations of the invention.

FIG. 6 is a chart illustrating bit error rate versus signal to noise ratio ("SNR") for various types of data encoding. FIG. 7 is a chart illustrating SNR versus fiber length at a data rate of 3.125 gigabits per second for various implementations of the invention. Line 702 illustrates SNR for an example FFE and Viterbi equalization implementation. Line 704 illustrates SNR for an example FFE and DFE implementation. Line 706 illustrates SNR for an example FFE implementation. Lines 710 and 712 illustrate bit error rates of $10^{-12}$ and $10^{-15}$, respectively.

In the examples above, each type of equalization and combination of types of equalization provides improved SNR. In the example of FIG. 7, FFE and Viterbi equalization performed in combination with one another provide a higher SNR than FFE only and higher than FFE and DFE performed in combination with one another. The SNR provided by FFE alone, and by FFE and DFE in combination, are, however, sufficient for many applications.

The examples herein illustrate that equalization can be performed on electrical representations of optical signals. The example results also illustrate that equalization in optical receivers enables the use of greater fiber lengths between transmitters and receivers. For example, transmission over 600 or more meters of standard 62.5/125 μm multi-mode fiber between transmitters and receivers is now possible at data rates of, for example, 3.125 gigabits per second.

The examples herein are provided for illustrative purposes. The invention is not limited to these examples.

II. HIGH SPEED, DSP-BASED RECEIVER

In accordance with an aspect of the invention, the receiver 100 is implemented as a high speed, or high data rate, DSP-based receiver that receives and digitally processes high data rate data signals 102. High data rate signals generally include data signals in the giga bits per second range. A high data rate, DSP-based receiver in accordance with the invention can be implemented to receive optical and/or electrical data signals 102.

Generally, a high data rate receiver 100, having a high data rate ADC 108 and a high speed DSP 110, would require one or more high speed (e.g., gigahertz range) clocks. To facilitate implementation on a chip for high data rates, in accordance with an aspect of the invention, parallel processing is implemented wherein each parallel path operates at a lower clock rate.

A. Parallel ADC and DSP

FIG. 10A illustrates the receiver 100 implemented as a parallel receiver, wherein the ADC 108 is implemented as an array of N ADCs 1012-1 through 1012-N, and the DSP 110 is implemented with M parallel paths 1014-1 through 1014-M, where M=kN. The N ADCs 1012-1 through 1012-N and the M DSP paths 1012-1 through 1014-M operate at lower data rates than the received data signal 102. It is important to observe that the DSP paths need not be independent from one another. In other words, there could be cross-connections among the different DSP paths 1014-1 through 1014-M. For simplicity of the drawing, these interconnections are not shown in FIG. 10A.

In an example embodiment, M=N=4 (i.e., k=1). Other embodiments use other values for N, M, and k. Motivations to use other values of k, for example k=2, include, without limitation, further reducing the clock speed to operate DSP blocks in the receiver. This can be the situation, for example, when implementing complicated algorithms requiring elaborate DSP architectures. In all the examples provided in this disclosure it is assumed that M is larger than or equal to N, therefore k is larger than or equal to one. However, it will be clear to anyone skilled in the art that other embodiments where N is larger than M are also possible without departing from the spirit and scope of the present invention. This situation could arise, for example, if high-resolution ADCs were needed. In general there is a tradeoff between speed and resolution in the design of the ADC. Therefore in an application where high resolution ADCs are necessary, the speed of each path would be lower and the number of ADC paths required would increase. This could lead to a situation where N is larger than M. It will be clear that all the techniques disclosed herein can be applied equally well in this situation. However, for simplicity of description, the examples provided in this disclosure use M larger than or equal to N.

In FIG. 10A, the data signal 102 is received and digitized into a plurality of N parallel signals 104-1 through 104-N by the array of N lower speed ADCs 1012-1 through 1012-N. The ADCs 1012-1 through 1012-N can be single-bit ADCs or multi-bit ADCs. Each of the plurality of digitized parallel signals 104-1 through 104-N typically have a sampling rate lower than the symbol rate of the received data signal 102, but taken together, have a sampling rate substantially the same or higher than the symbol rate of the received data signal 102. In an embodiment, the received data signal 102 is a high data rate (e.g., gigabit(s) per second range) data signal. If the modulation scheme is binary (it encodes only one bit per symbol) the symbol rate is substantially equal to the data rate. The symbol rate can be reduced without reducing the data rate by using multilevel modulation schemes such as pulse amplitude modulation (PAM). For example, two bits per symbol could be transmitted by using a 4-level PAM modulation scheme (PAM-4). A binary modulation scheme is also known as PAM-2 (other common names are On-Off Keying (OOK) or binary antipodal signaling). In order to properly recover the data transmitted from the remote end, the receiver needs to take at least one sample per symbol of the received signal. These type of receivers are usually called "baud-rate-sampled receivers". However in some implementations the receiver could take more than one sample per symbol. These receivers are often called "oversampled receivers", or "fractionally-spaced receivers". Baud-rate-sampled receivers are usually more economical because, for the same symbol rate, they require lower speed ADCs than oversampled receivers. However, it will be clear to anyone skilled in the art that the techniques disclosed in this invention can be applied equally well to baud rate sampled and/or oversampled receivers, as well as to receivers using a variety of modulation schemes, including, but not restricted to, PAM-2, multilevel PAM, single-carrier or multi-carrier quadrature amplitude modulation (QAM), etc.

A timing recovery module 1018 performs timing recovery and provides one or more clock signals 1019 to the ADC converter array 108. In an embodiment, the timing recovery module 1018 operates the N lower speed ADCs 1012-1 through 1012-N in a staggered, or interleaved fashion. In other words, different phases of the clock signals 1019 are provided to each of the ADCs 1012-1 through 1012-N. The different phases are staggered from one another so that each ADC 1012-1 through 1012-N samples a different portion or phase of the data signal 102. Interleaved samples 104-1 through 104-N from the ADCs 1012-1 through 1012-N are aligned by a retiming module 1016. Further signal processing is performed in the M-path DSP 110.

Example operation of the DSP-based parallel receiver 100 illustrated in FIG. 10A is now described for a case where the optical data signal 102 is a 10 gigabit per second data signal and the ADC converter array 108 includes eight ADCs 1012 (in other words, N=8 in this example), each operating at approximately 1250 MHz. The timing recovery module 1018 outputs a 1250 MHz, eight-phase clock signal 1019 on a bus, one phase for each of the ADCs 1012-1 through 1012-N. The eight-phase clock signal 1019 operates the ADCs 1012-1 through 1012-N at 1250 MHz, separated in phase from one another by 45 degrees (i.e., 360 degrees/8 phases), in this example.

A parallel DSP-based receiver in accordance with the invention is useful for receiving high data rate signals including, without limitation, optical and/or electrical high data rate signals. A high data rate DSP-based receiver in accordance with the invention is useful for lower data rate applications as well.

In an embodiment, the timing recovery module 1018 includes an individual timing recovery loop for each of the ADC paths defined by the ADCs 1012-1 through 1012-N. Individual timing recovery loops are described below.

FIG. 10B illustrates an example implementation of the parallel DSP-based receiver 100 illustrated in FIG. 10A, wherein the ADC 108 is a 4-path ADC 108 and the DSP 110 is an 8-path DSP 110 (i.e., N=4, M=8, and k=2). The example 8-path DSP 110 includes an 8-path parallel FFE 1020 and an 8-path parallel Viterbi decoder 1022. Example implementations of parallel Viterbi decoders are described below. Additional example implementations of the M-path DSP 110 are provided below. The present invention is not, however, limited to these examples. Based on the description herein, one skilled in the relevant art(s) will understand that other N-path ADC and/or M-path DSP configurations are possible.

In FIG. 10B, the retiming module 1016 provides samples of the retimed signals to the parallel feedforward equalizer 1020, as well as to the timing recovery module 1018 and to the AGC 1010, as illustrated by the dotted lines.

In FIG. 10B the receiver 100 is illustrated with a programmable gain amplifier 1008 and an automatic gain control 1010. Implementation examples and operation of these components are described below.

In an embodiment, a parallel receiver in accordance with the invention is designed to receive a single electrical and/or optical data signal. Alternatively, a parallel receiver in accordance with the invention is designed to receive multiple electrical and/or optical data signals. In such an embodiment, the receiver 100 is repeated for each data signal 102. Each repetition of a parallel multi-path DSP-based receiver is referred to herein as a slice, each slice having one or more parallel ADC and/or DSP paths.

Figure 11A:
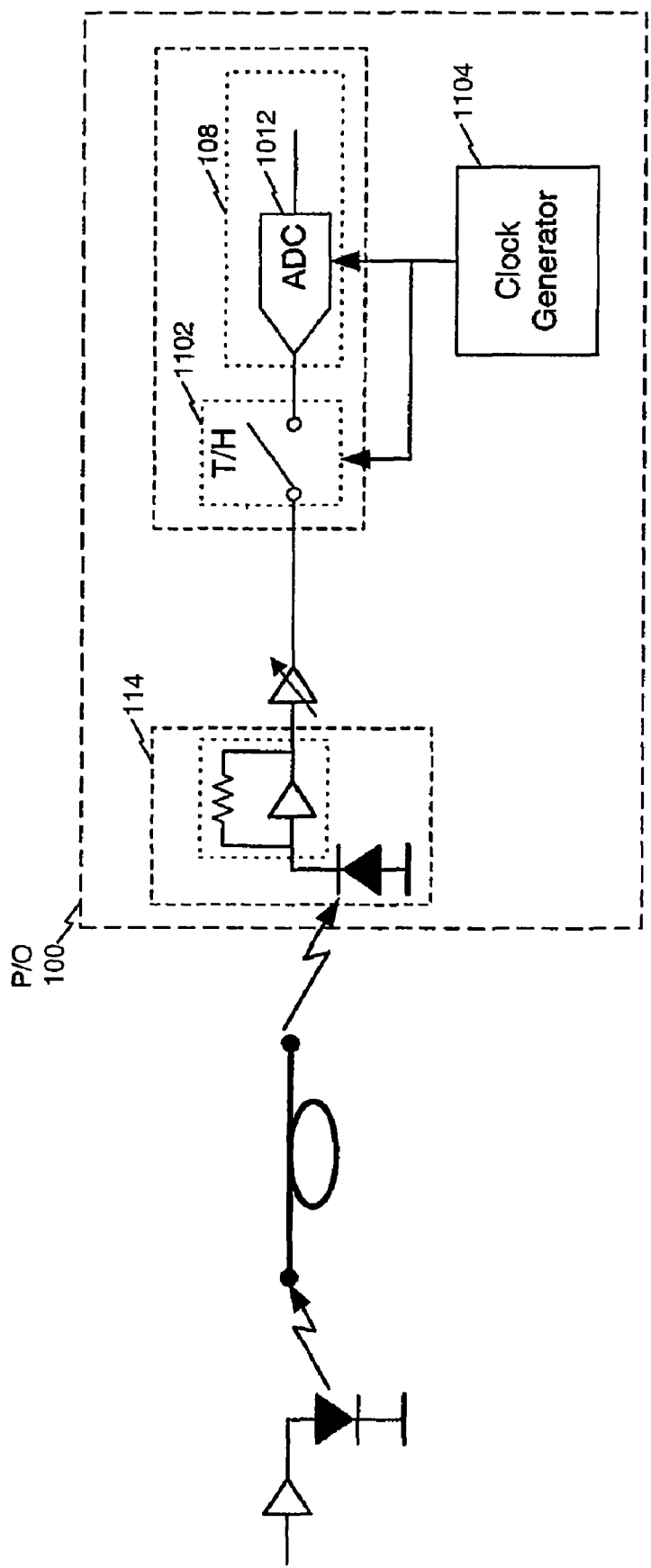
FIG. 11A is a block diagram of an example receiver that utilizes a track and hold device, in accordance with an aspect of the invention.

In an embodiment, the receiver 100, illustrated in FIG. 1A and/or FIG. 1B, is implemented with one or more track and hold devices. For example, FIG. 11A illustrates a block diagram of a portion of an example optical receiver including a track-and-hold device 1102 controlled by a clock generator 1104. The track and hold device provides a constant analog value to the ADC 108. One skilled in the relevant art(s) will understand that the track and hold device 1102 and clock generator 1104 can be implemented in an electrical data receiver as well.

Figure 11B:
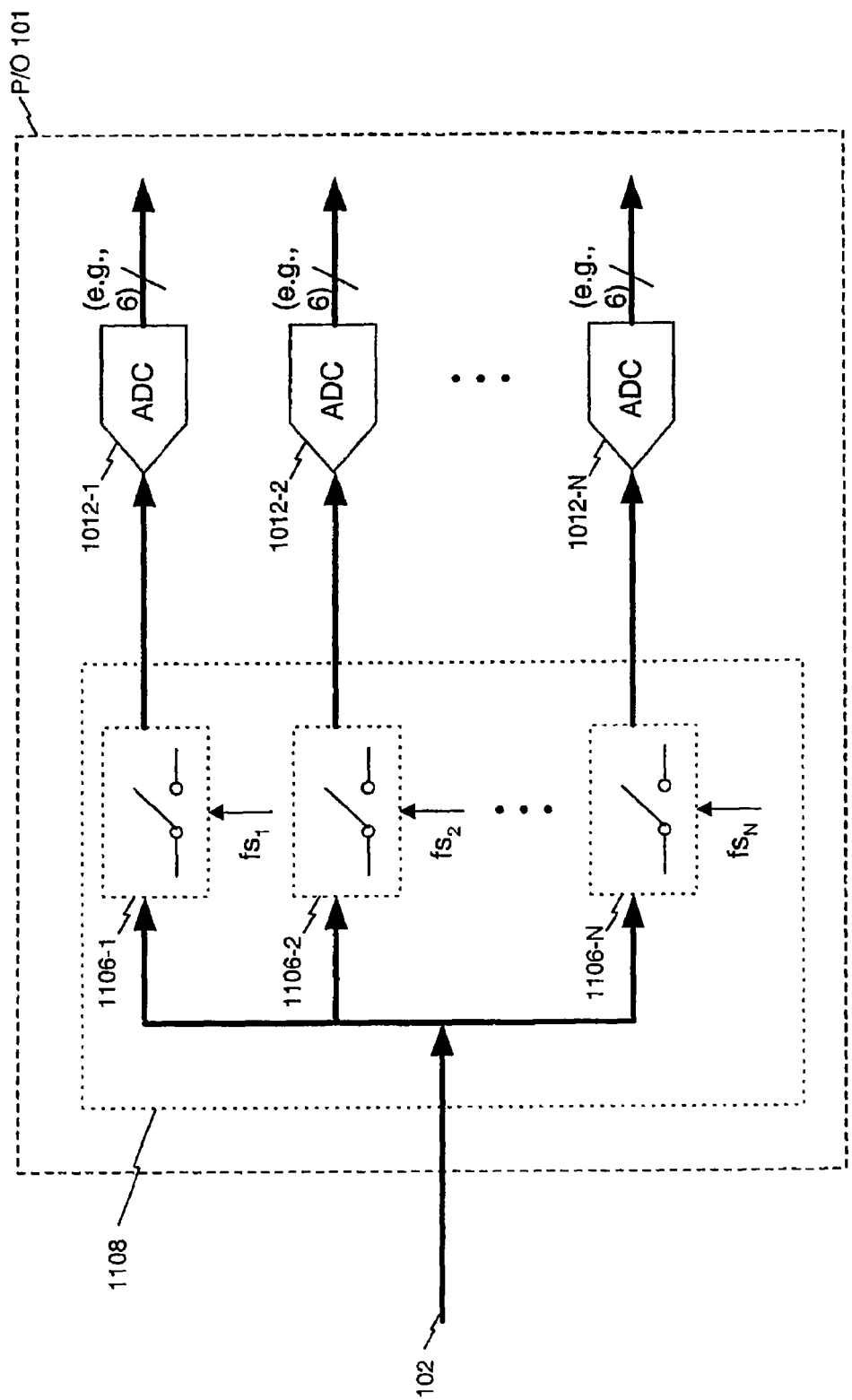
FIG. 11B is a block diagram of an example receiver that utilizes multiple track and hold devices in parallel, in accordance with an aspect of the invention.

In an embodiment, the multi-path receiver 100, illustrated in FIG. 10A, is implemented with a plurality of track and hold devices. FIG. 11B illustrates a block diagram of a portion of an example parallel receiver including an array 1108 of parallel track and hold devices 1106-1 through 1106-N. As with the track and hold device 1102 in FIG. 11A, the array 1108 may be part of an electrical data signal receiver as illustrated in FIG. 1A, and/or as part of an optical receiver as illustrated in FIG. 1B.

III. DESIGN AND CONTROL CONSIDERATIONS

In accordance with parallel multi-path receiver aspects of the invention, one or more of a variety of types of gain and/or phase errors and interleave path mismatches are detected and compensated for. Such errors and mismatches can be compensated for on a path-by-path basis and/or on a system wide basis. Compensation design and control considerations for parallel receivers are now described.

A. Path-Based Timing Recovery and Phase Error Compensation

Referring to FIG. 10A, in an interleaved embodiment, the multi-phase sampling clock 1019 provided by the clock recovery module 1018 is generated by dividing down a higher frequency clock. Imperfections in the clock dividing circuitry, however, potentially lead to phase differences between the paths that depart from the intended value. This error has a systematic component and a random component.

Most of the random component typically originates in the random jitter of the high-frequency clock from which the N-phase sampling clock 1019 is derived. Therefore the random error component tends to be approximately similar for the N interleaved ADCs.

The systematic component of the sampling phase error, however, tends to originate in a divider circuit, typically implemented within a timing recovery module, such as the timing recovery module 1018 illustrated in FIG. 10A, and also in mismatches in the propagation delays of the clocks from the timing recovery module to the individual track-and-hold devices (as shown in FIG. 11B, there is a track-and-hold device 1106-1 through 1106-N in front of each ADC 1012-1 through 1012-N) Therefore, the sampling instants of the input signal experience a periodic jitter with a fundamental frequency fs, where fs is the frequency of the sampling clock driving each track and hold. When looking at the digital samples of the complete interleaved array, the effect of these systematic sampling phase errors is an error in amplitude of the digitized samples. This error is detrimental to the accuracy of the ADC converter array 108, and it can be a performance-limiting factor.

In accordance with an aspect of the invention, therefore, methods and systems are now described for reducing systematic jitter. The methods and systems can be implemented in optical and/or electrical receivers. The methods and systems are based on the M-parallel DSP paths described above, which makes it possible to separate the timing recovery module 1018 into N loops, each loop responding to a phase error in a corresponding data path, which can then be compensated for in the corresponding N timing recovery loops.

FIG. 10C illustrates an example implementation of the timing recovery module 1018 including multiple timing recovery loops 1018-1 through 1018-N. Example implementations of the multiple timing recovery loops 1018-1 through 1018-N are provided below.

An advantage of separate timing recovery loops is that the systematic phase errors introduced in the multi-phase sampling clock 1019 by the frequency divider circuit can be independently compensated within the N independent timing recovery loops 1018-1 through 1018-N. This technique substantially reduces and/or eliminates the systematic component of the phase error in the interleaved ADC converter array 108, providing increased accuracy and ease of design. The systems and methods for compensating sampling phase errors described herein can be used in combination with one or more of a variety of timing recovery techniques.

Figure 10D:
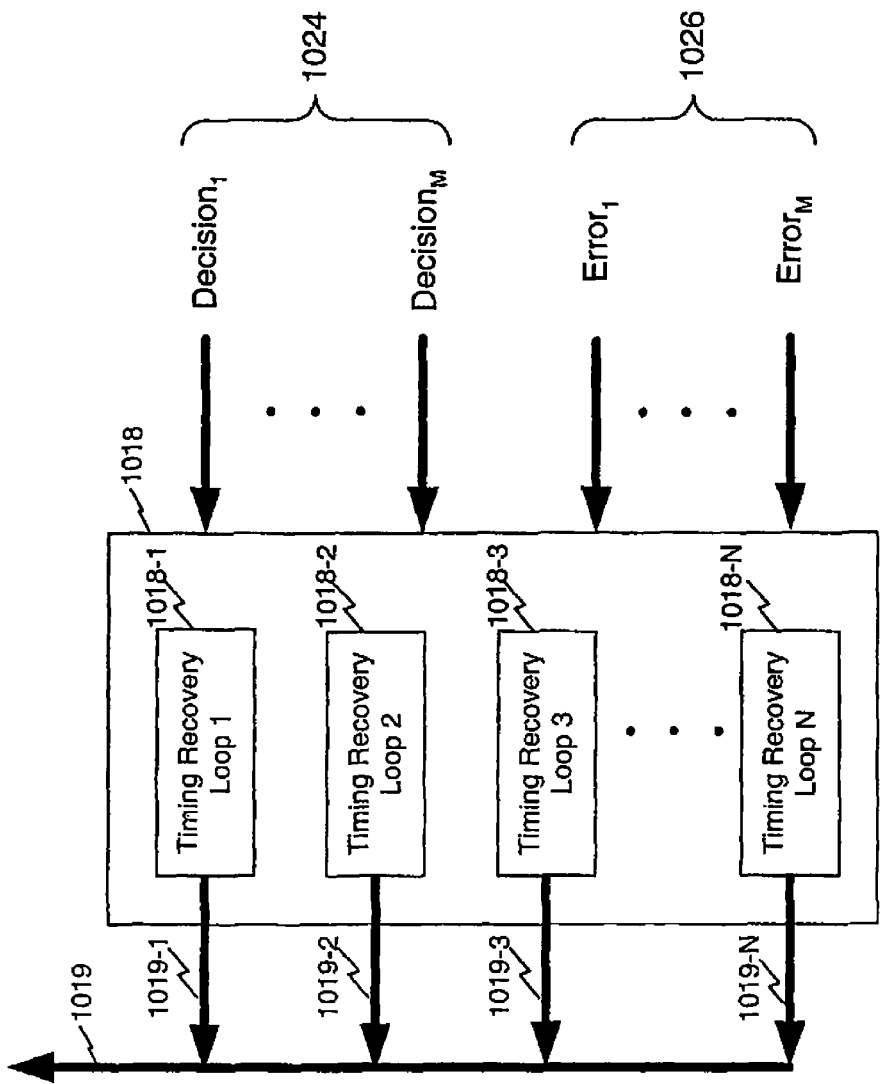
FIG. 10D illustrates an embodiment where the timing recovery module receives M decisions and M errors from the M DSP paths, in accordance with an aspect of the invention.

FIG. 10D illustrates an embodiment where the timing recovery module 1018 receives M decisions 1024 and M errors 1026 from the M DSP paths. The significance and use of the decisions 1024 and errors 1026 are described below.

Figure 10E:
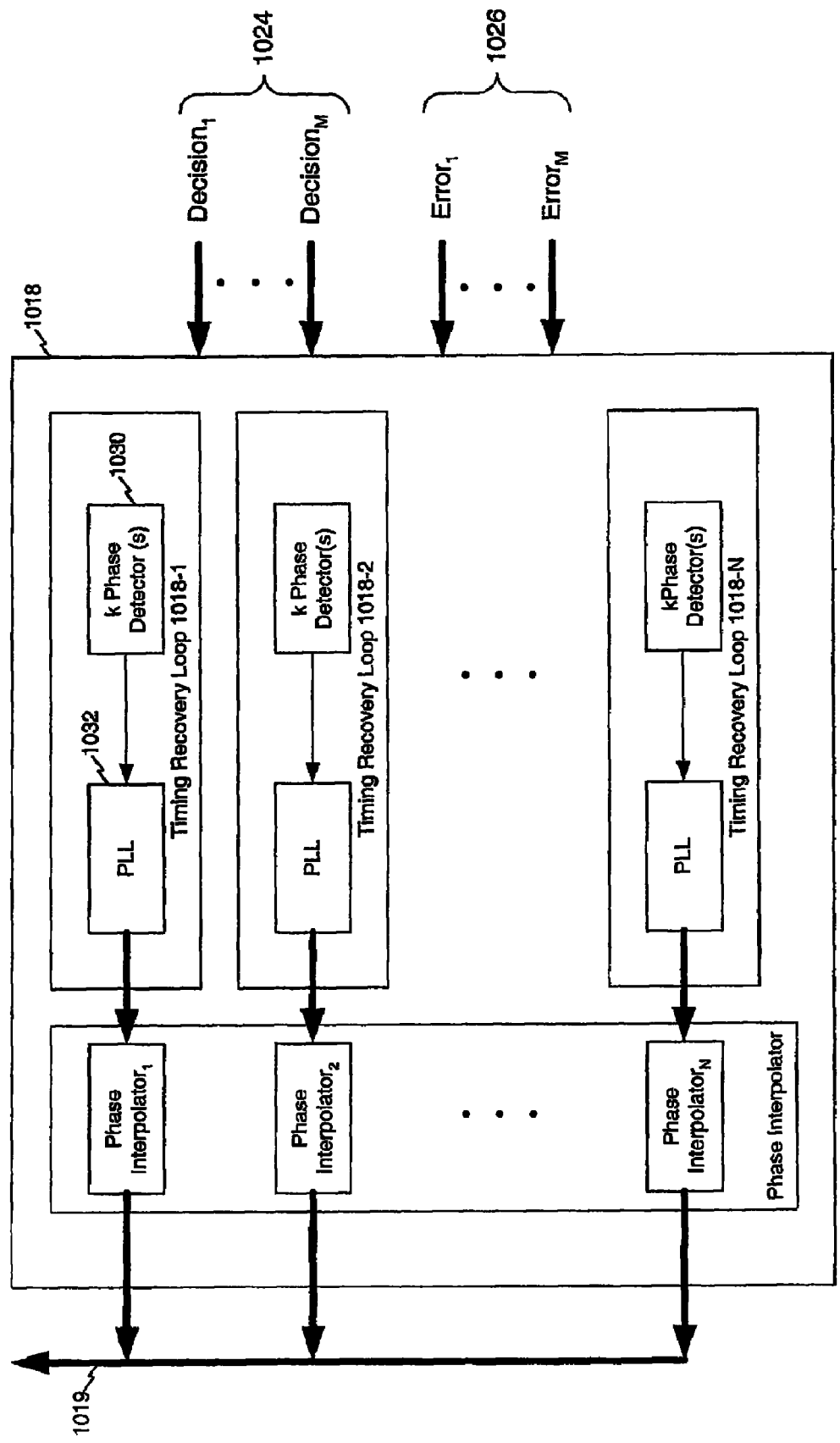
FIG. 10E illustrates an embodiment where each timing recovery loop includes a phase locked loop and k phase detectors, in accordance with an aspect of the invention.

FIG. 10E illustrates an embodiment where each timing recovery loop 1018-1 through 1018-N includes a phase locked loop 1032 and k phase detectors 1030. Recall that k relates the number of ADC paths N to the number of DSP paths M, where M=kN. Example implementations of the phase locked loop 1032 and k phase detectors 1030 are described below with respect to FIG. 18.

Figure 10F:
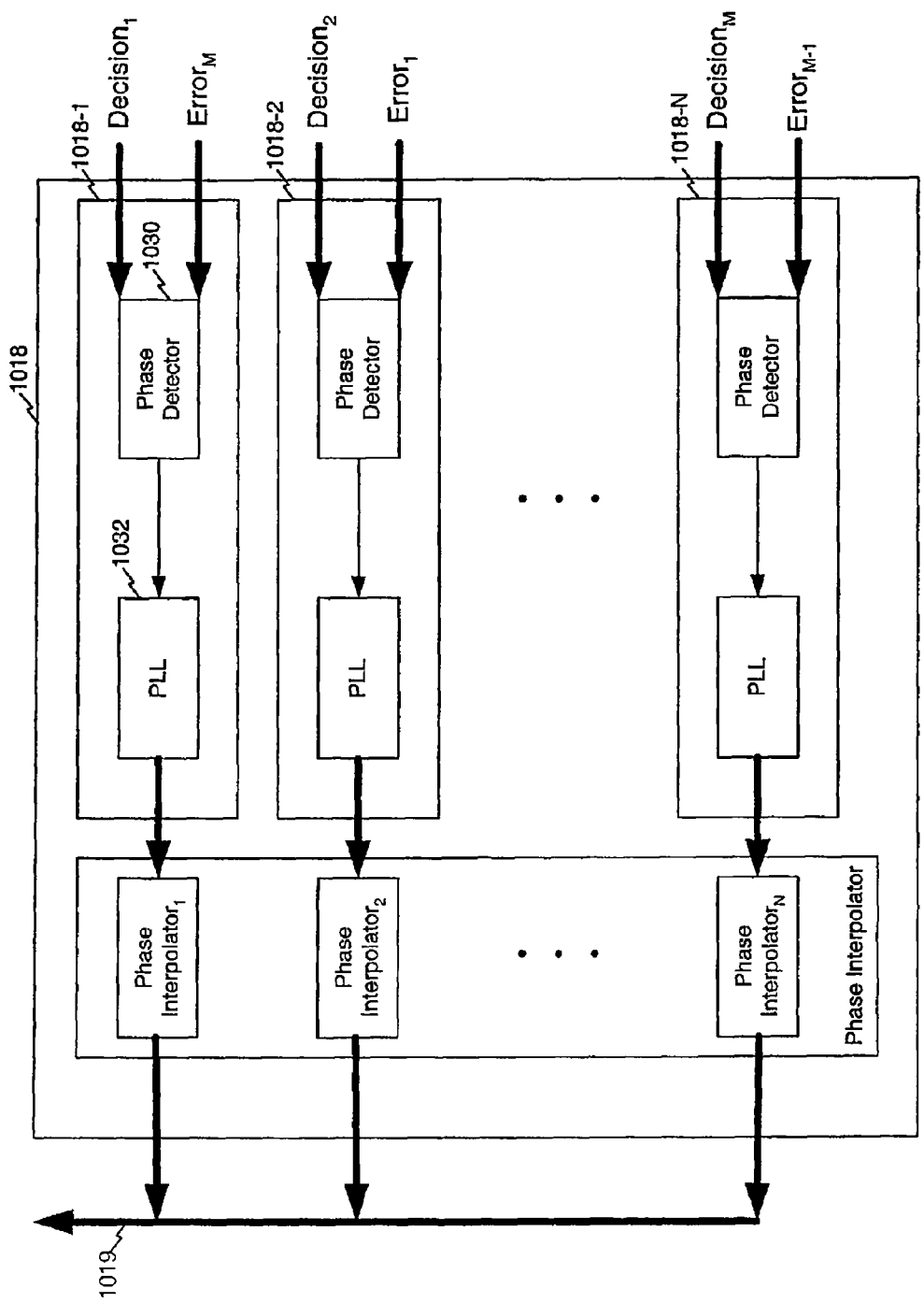
FIG. 10F illustrates an example embodiment where each timing recovery loop includes a phase locked loop and 1 phase detector, in accordance with an aspect of the invention.
Figure 10G:
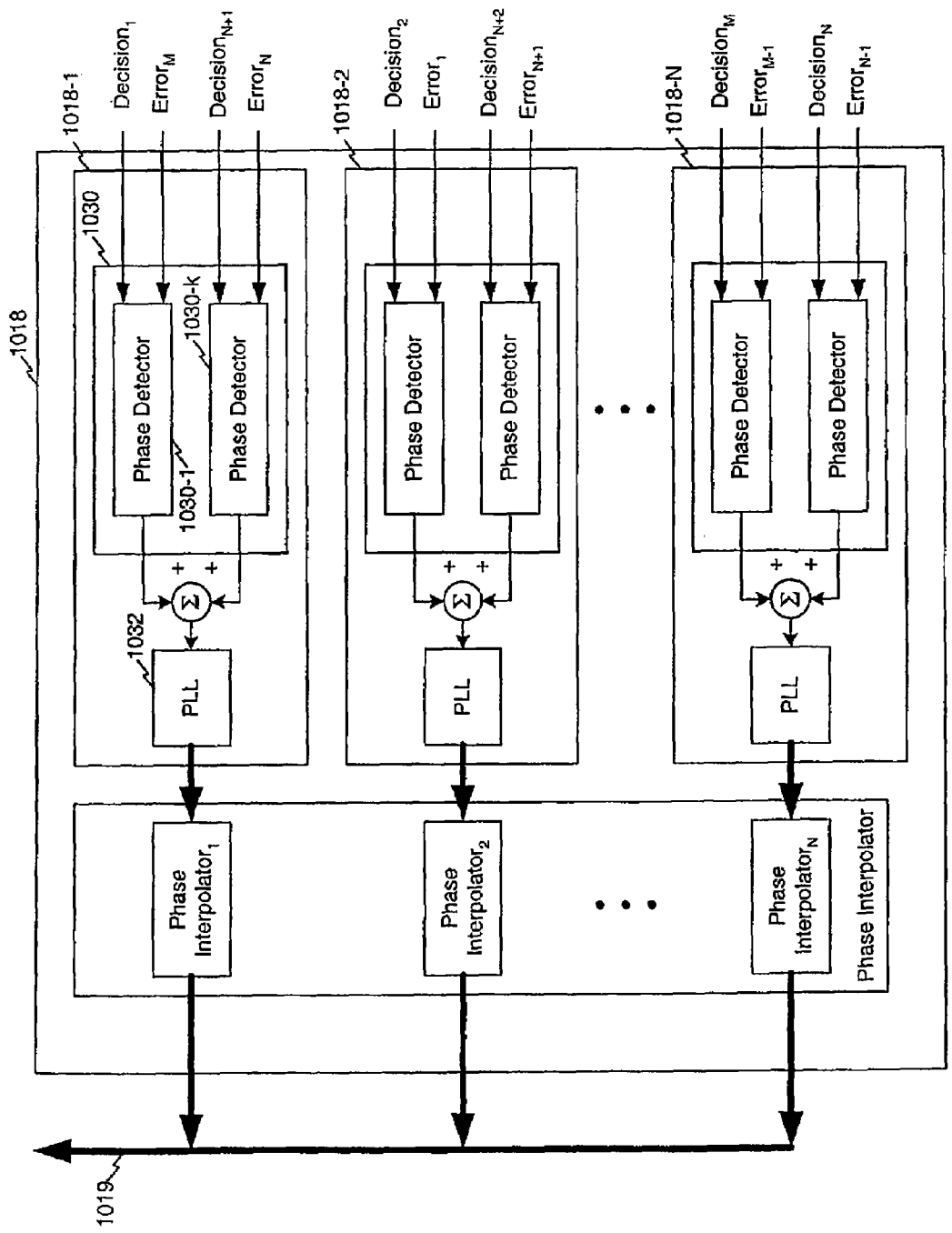
FIG. 10G illustrates an example embodiment where each timing recovery loop includes a phase locked loop and 2 phase detectors, in accordance with an aspect of the invention.

The M decisions 1024 and M errors 1026 can be utilized by the timing recovery loops 1018-1 through 1018-N in a variety of ways, depending upon the number of ADC paths N and the number of DSP paths M. In other words, based upon the value of k. For example, FIG. 10F illustrates an example implementation for k=1. FIG. 10G illustrates an example implementation for k=2. These example implementations are described below with respect to FIGS. 17 and 18. Based upon the description herein, one skilled in the relevant art(s) will understand how to implement the invention for other values of k as well.

Figure 10H:
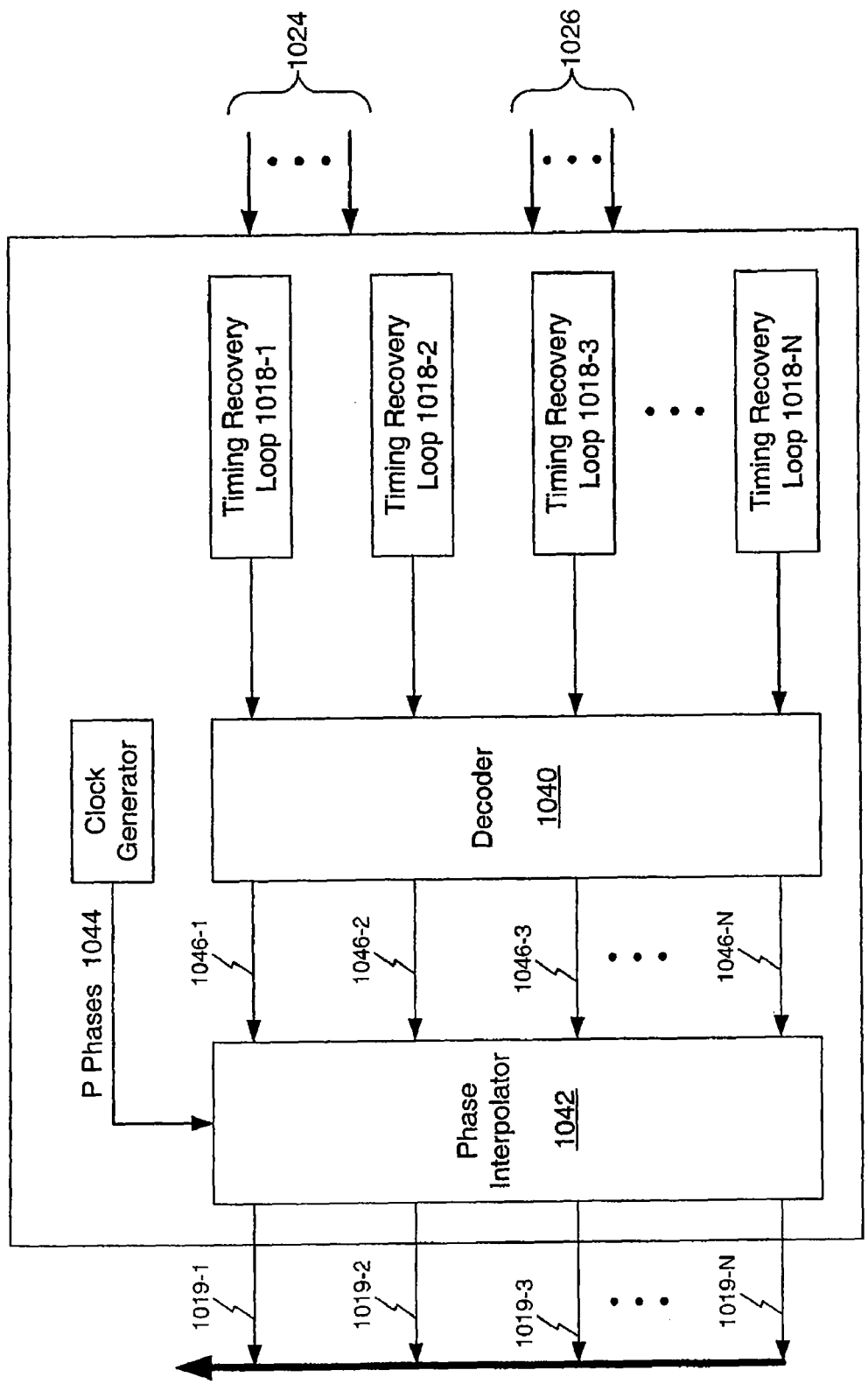
FIG. 10H illustrates an example implementation wherein the timing recovery module includes a decoder and a phase selector/phase interpolator, in accordance with an aspect of the invention.

FIG. 10H illustrates an example implementation wherein the timing recovery module 1018 includes a decoder 1040 and a phase selector/phase interpolator 1042. The phase selector/phase interpolator 1042 receives P phases 1044-1 through 1044-P, where P is an integer, from a clock generator. The phase selector/phase interpolator 1042 also receives N phase interpolator control signals 1046-1 through 1046-N from the decoder 1040. Alternatively, the phase selector/phase interpolator 1042 receives the N phase interpolator control signals 1046-1 through 1046-N directly from the timing recovery loops 1018-1 through 1018-N.

The phase selector/phase interpolator 1042 outputs N phases 1019-1 through 1019-N. P does not necessarily equal N. For example, in an embodiment, P=4 and N=8. In another embodiment, P=N=4. The invention is not, however, limited to these examples. Based on the description herein, one skilled in the relevant art(s) will understand that other values for N and P can be used. Example implementations of the phase selector/phase interpolator 1042 are described below with respect to FIGS. 8 and 19.

Figure 17:
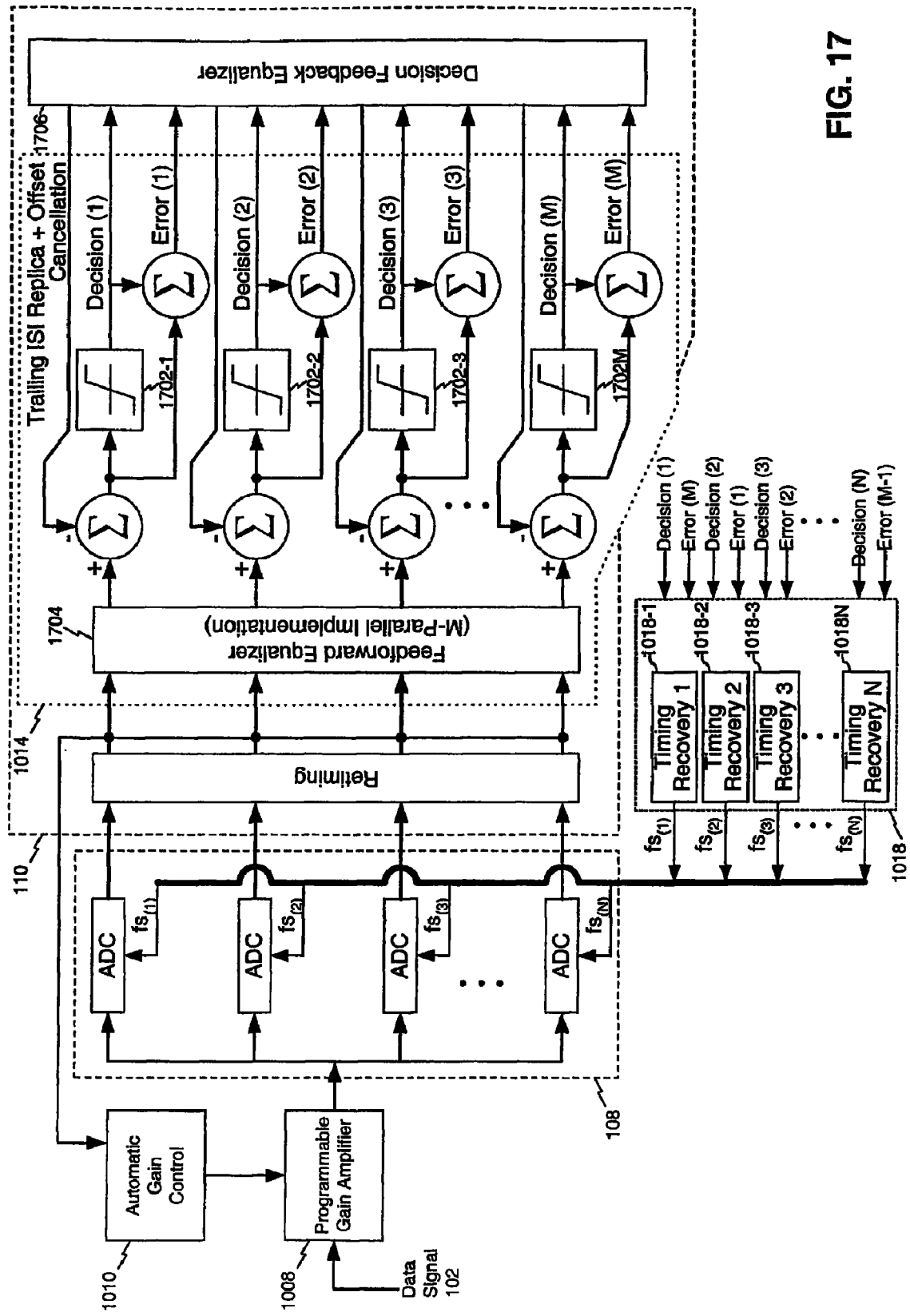
FIG. 17 is a block diagram of a parallel receiver with independent timing recovery loops for each parallel path, in accordance with an aspect of the invention.

FIG. 17 illustrates an example implementation of the timing recovery loops 1018-1 through 1018N wherein each timing recovery loop 1018-1 through 1018-N receives a decision from a corresponding DSP path and a sample of the slicer error from an adjacent DSP path. This configuration is described below with respect to FIG. 18. Each timing recovery loop 1018-1 through 1018N is designed to drive its associated path phase error towards zero.

Figure 18:
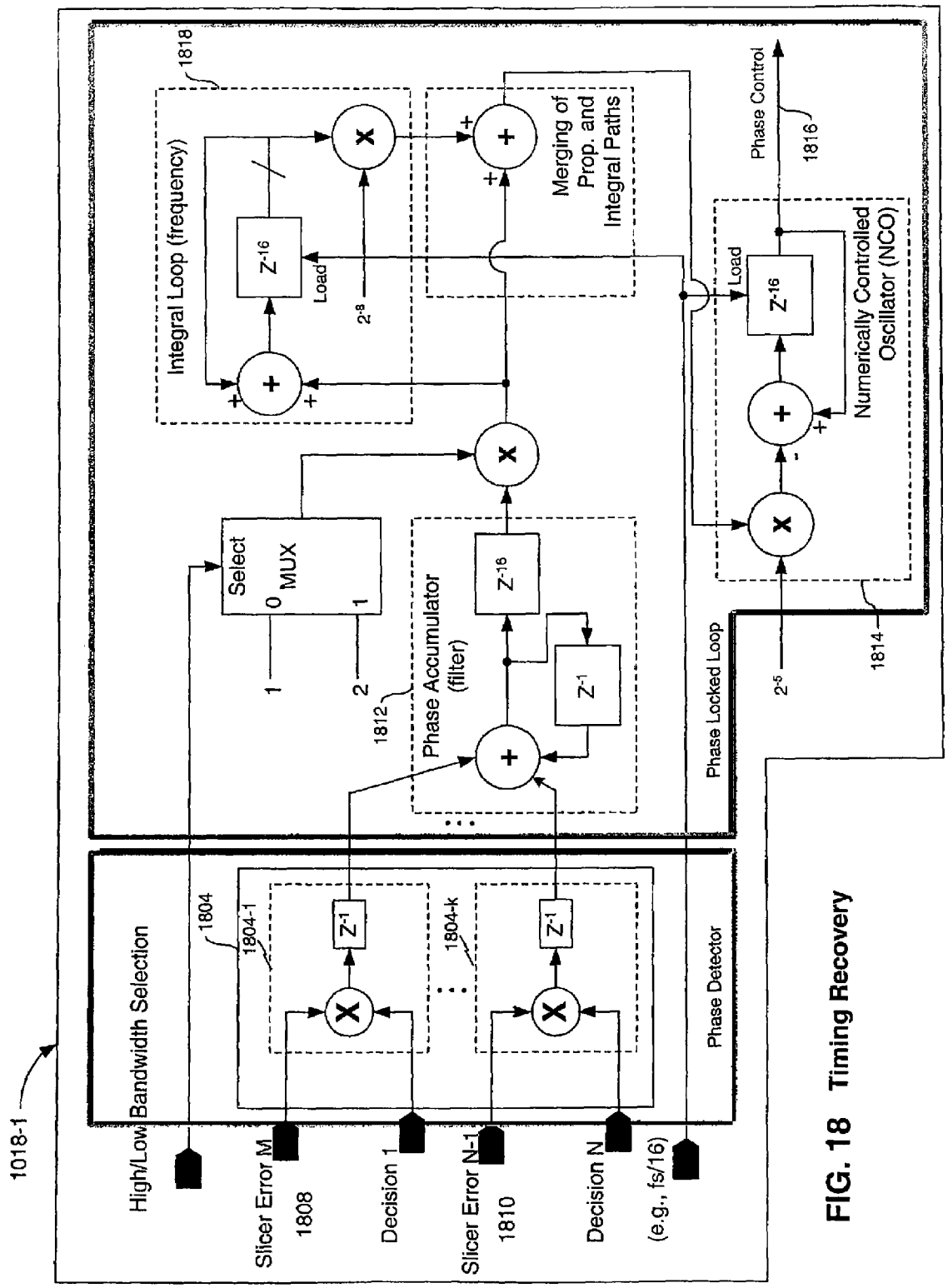
FIG. 18 is a block diagram of an example timing recovery block in accordance with an aspect of the invention.

In the embodiment of FIG. 17, the M-path DSP 110 includes an FFE 1704, a DFE 1706, and slicers 1702-1 through 1702-M. Decisions and slicer error signals are shown as being taken from slicers 1702-1 through 1702-M. Phase error signals are computed by the timing recovery modules 1018-1 through 1018N, based on the decisions and the slicer errors, as shown in more detail in FIG. 18 This corresponds to an exemplary decision-directed timing recovery algorithm. However, other timing recovery algorithms can be utilized FIG. 18 is a block diagram of an example implementation of the timing recovery loop 1018-1 illustrated in FIGS. 10C-10H and FIG. 17. Timing recovery loops 1018-2 through 1018-N are similarly configured. In FIG. 18, the timing recovery loop 1018-1 includes k phase detectors 1804-1 through 1804-k, which generate k phase error signals 1806-1 through 1806-k. Each phase error signal 1806-1 through 1806-k is generated by cross-correlating a decision 1810 for a given path with a slicer error 1808 corresponding to an adjacent path, as illustrated in FIGS. 10F and 10G, for example.

The phase error signals 1806-1 through 1806-k are computed in the exemplary embodiment of FIG. 18, by, for example, using a variety of the well-known Mueller and Muller algorithm, where the phase error is based on the precursor of the channel impulse response at the output of the FFE, with the precursor taken one symbol period before the sample on which the decision is based. In this algorithm, the phase error is computed with the slicer error delayed by one symbol period. In a serial implementation this is achieved, for example, by introducing a pipeline register clocked at the symbol rate in the error path going to the phase detector. In a parallel-processing implementation, the one symbol delay of the error is achieved by, for example, taking the error sample from an adjacent path, as shown in FIG. 17. In other words, the decision 1810 comes from the same path where phase is being controlled, but the error 1808 comes from an adjacent path.

The phase error signals 1806-1 through 1806-k are filtered by an accumulate and dump filter 1812 and further filtered by an integral filter 1818. The sum of the proportional and integral paths is used to control a numerically controlled oscillator ("NCO") 1814. Therefore the phase locked loop illustrated by FIG. 18 is a second-order (or proportional plus integral) loop. Digital control words 1816 generated by the NCO 1814 control a phase selector (not shown in FIG. 18).

Figure 8:
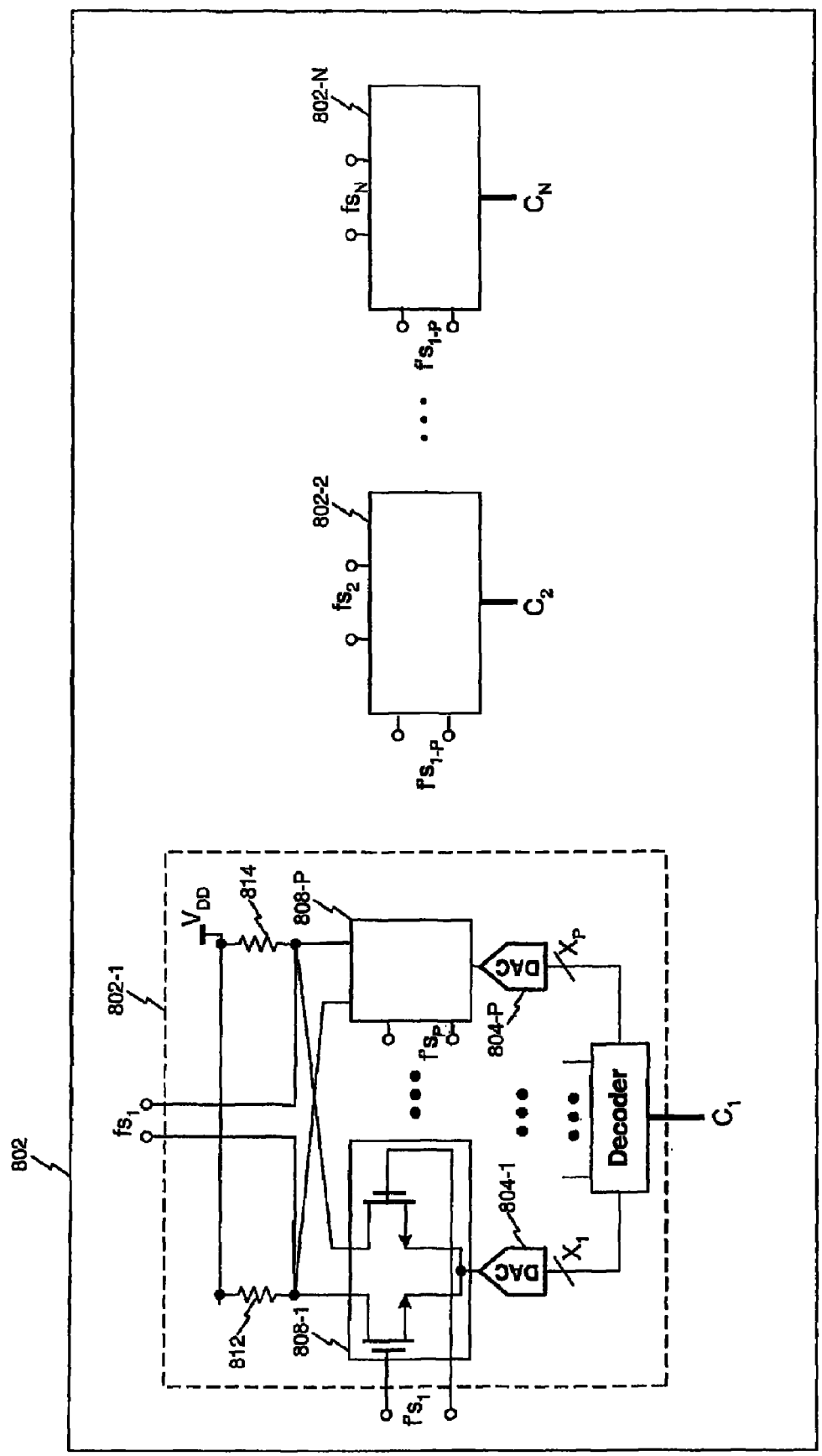
FIG. 8 illustrates an example analog phase interpolator that can be implemented with the digital timing recovery system illustrated in FIG. 17, in accordance with an aspect of the invention.
Figure 19:
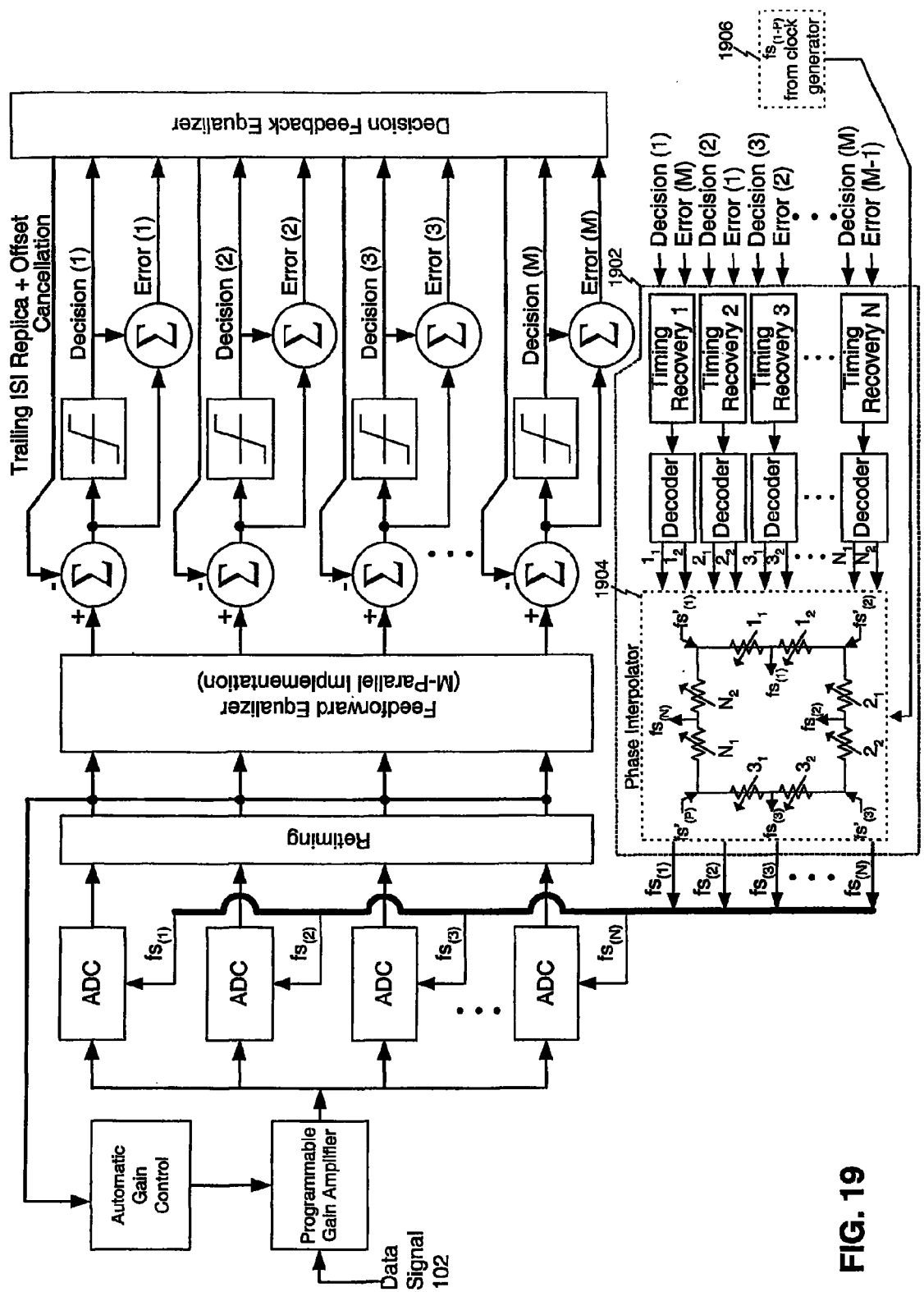
FIG. 19 illustrates an example analog phase interpolator that can be implemented with the digital timing recovery system illustrated in FIG. 17, in accordance with an aspect of the invention.

In an embodiment, the selector digitally generates multi-phase sampling clocks by, for example, taking a weighted sum of multiple (e.g., 4), phases with finite rise and fall times. FIGS. 8 and 19 illustrate example phase selectors in accordance with aspects of the invention. The example phase selector in FIG. 8 generally provides faster response times. Alternatively, a conventional phase selector is utilized. The present invention is not, however, limited to digitally controlled phase selectors.

Independent timing recovery loops can be implemented in optical and/or electrical receivers.

1. DAC-Based Phase Selector

FIG. 8 illustrates an example phase selector 802 in accordance with an aspect of the invention. The phase selector 802 shown in FIG. 8 exemplifies a situation where the number of output phases $fs_1$ through $fs_N$ may be different from the number of input phases $f's_1$ through $f's_P$. The number of output phases $fs_j$ through $fs_N$ is always N, the same as the number of ADC paths. However the number P of input phases $f's_1$ through $f's_P$ could be smaller than N. In an embodiment, N is a multiple of P.

The phase selector 802 includes N interpolator sub-blocks 802-1 through 802-N, that receive digital control words $C_1$ through $C_N$, respectively. The digital control words $C_1$ through $C_N$ correspond to the phase interpolator control signals 1046-1 through 1046-N described above with respect to FIG. 10H.

In FIG. 8, phase interpolator sub-block 802 is illustrated in detail, operation of which is now described. The digital control word $C_1$ is applied through a decoder to current-mode digital-to-analog converters ("DACs") 804-1 through 804-P, which control the bias current of respective differential pairs 808-1 through 808-P. The inputs to the differential pairs 808-1 through 808-P are taken from consecutive input phases. The drain currents of the differential pairs 808-1 through 808-P are combined in output resistors 812 and 814, which generate the output phase $fs_1$. The output $fs_1$ is thus a weighted sum of $f's_1$ through $f's_P$, wherein the weighting is determined by the DACs 804-1 through 804-P, under control of the control signal $C_1$.

There are N phase interpolator sub-blocks 802-1 through 802-N, each one corresponding to an output phase. The number of input phases P is typically smaller than the number of output phases, N. It must be noted that, although the circuit shown in FIG. 8 uses particular components such as NMOS transistors and resistors, there are many alternative implementations, including, but not limited to, other integrated circuit technologies such as silicon germanium, bipolar, indium phosphide, gallium arsenide, etc. The essential aspect of this phase selector 802 is the use of digitally controlled weighted sums of two input phases to generate an output phase. This concept can be implemented in many alternative ways without departing from the spirit and scope of the present invention, as will be clear to anyone skilled in the art.

2. Resistive Interpolation Ring

In an embodiment, multi-phase sampling clocks 1019 are generated by a resistive phase interpolator. FIG. 19 illustrates an example timing recovery block 1902 implementation, which is a more detailed version of the timing recovery block 1018 illustrated in FIG. 17. The timing recovery block 1902 includes a resistive interpolation ring phase selector 1904. Input phases $f's_{1-N}$ 1906 from a clock generator are provided to the resistive interpolation ring phase selector 1904. In an embodiment, the input phases $f's_{1-N}$ 1906 are derived from a divider operating on an independent clock. When the frequency of operation of the divided down clock is relatively high, the clock edges tend to have finite rise and fall times that are comparable to the period of the waveform. The number of input phases P need not be the same as the number of ADC paths N. This is explained more clearly in connection with FIG. 8.

By interpolating between two such waveforms of phase difference corresponding to a quarter of a period, new waveforms, $fs_{1-N}$, with phase differences corresponding to fractions of, for example, a quarter of a period from the original signals $f's_{1-N}$ 1906 are obtained. In an embodiment, the phase difference is electrically controlled by changing the relative interpolation factors by, for example, changing the values of the interpolation resistors in a digital fashion, driven by, for example, the timing recovery circuit.

The example phase selector implementations described herein are provided for illustrative purposes. The present invention is not limited to these examples. Based on the teachings herein, one skilled in the relevant art(s) will understand that other phase selector methods and systems can be utilized.

B. Gain and Offset Mismatch Compensation

In accordance with an aspect of the invention, methods and systems are provided for reducing gain errors, offsets, and/or undesired sampling clock phase differences among the paths defined by the ADCs 1012-1 through 1012-N.

1. DSP-Based Adaptive Path Gain and Offset Mismatch Control

In accordance with an aspect of the invention, gain and offset mismatches between paths are compensated for in a DSP, wherein gain factors adapt for individual paths.

Figure 12:
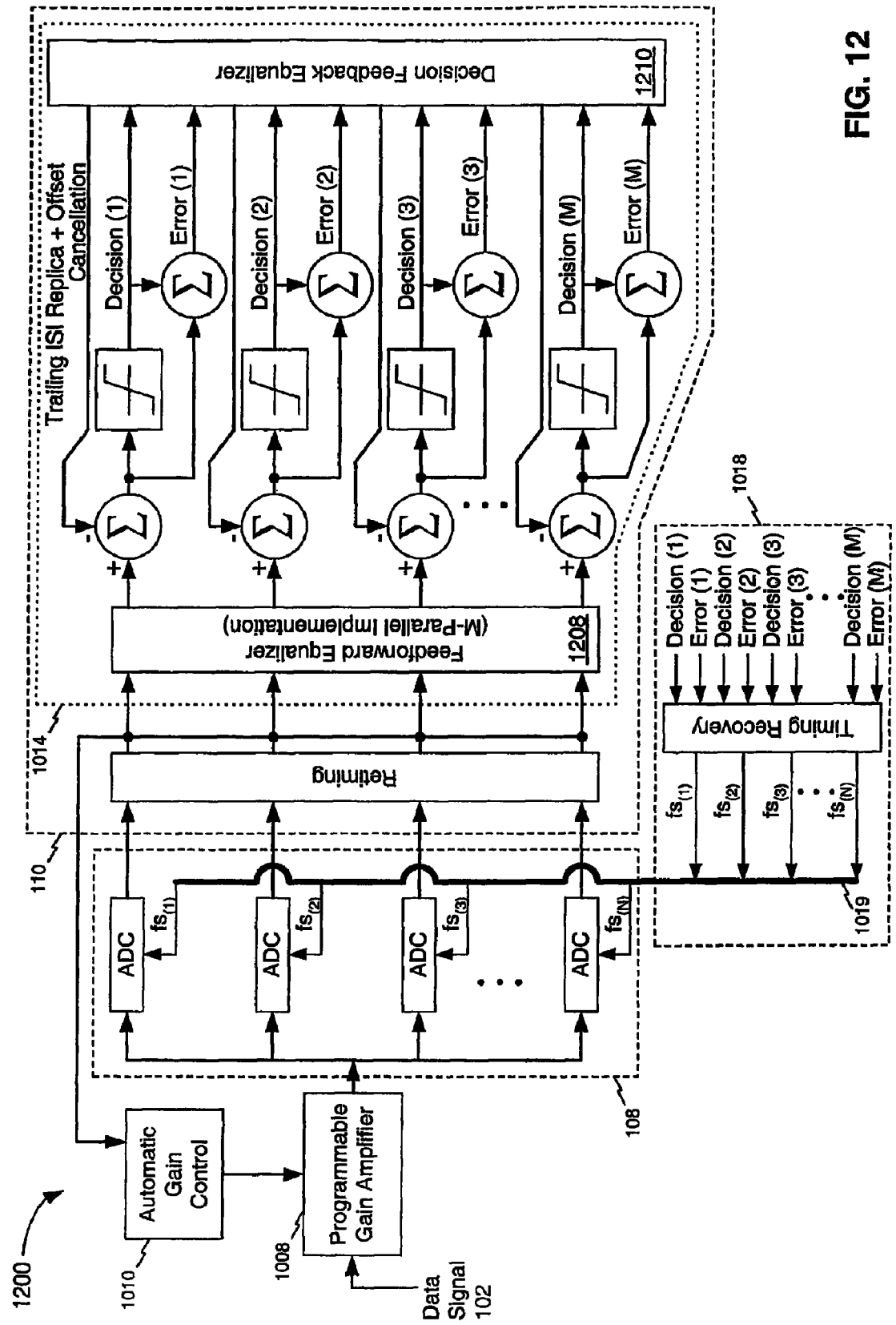
FIG. 12 illustrates an example parallel receiver that utilizes, among other things, DFE-based offset cancellation on a per path basis, in accordance with an aspect of the invention.
Figure 14:
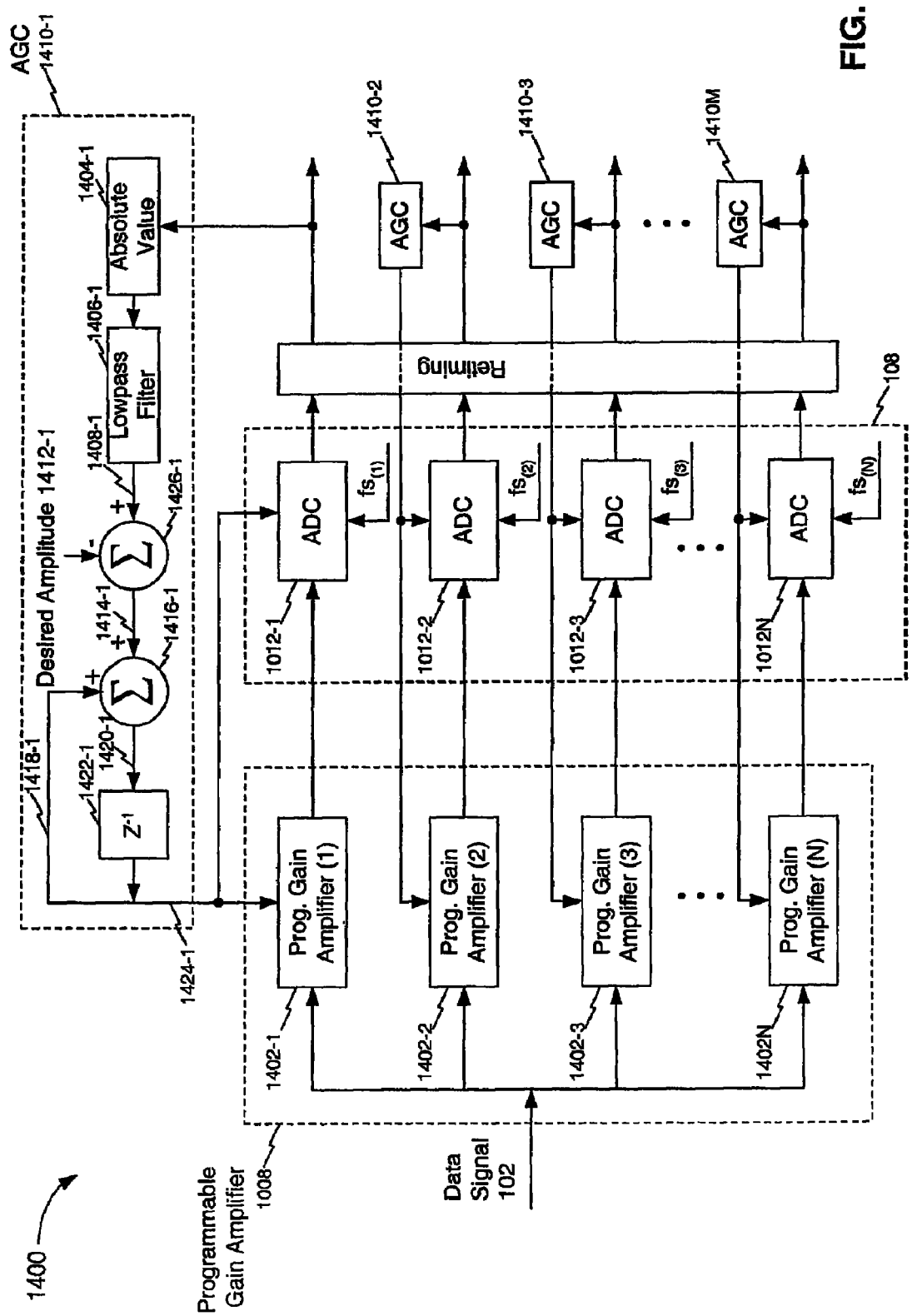
FIG. 14 illustrates an example programmable gain amplifier and an example automatic gain control module, in accordance with an aspect of the present invention.

FIG. 12 illustrates an example DSP-based parallel receiver 1200 implementation of the receiver 100 illustrated in FIG. 10A. The receiver 1200 utilizes DFE-based offset cancellation on a per path basis, in accordance with an aspect of the invention. Under this approach, offsets originating in the ADC or anywhere in the analog front end are individually controlled for each ADC path by an adaptive equalizer adaptation algorithm to compensate the offsets in the digital domain independently for each path. In the embodiment of FIG. 14, a single Programmable Gain Amplifier 1008 with global gain control is shown, which means that independent gain errors in the ADC paths are not independently compensated in the analog domain. As will be discussed later, independent gain control for each ADC path can also be implemented in the digital domain using the Feed-forward Equalizer. FFE-based digital control can be omitted where, for example, the gain errors of the ADC paths can be accurately controlled by design, thus requiring little or no digital gain mismatch compensation. In a more common situation, relatively significant gain mismatches exist among the ADC paths, therefore digital compensation of gain mismatches is preferred. A scheme where gain mismatches in the ADC paths are individually compensated in the analog domain will be discussed later in connection with FIG. 14. Alternatively, gain mismatches can be digitally compensated using the Feed-forward Equalizer. FIG. 12 also shows the independent phase error compensation technique already discussed in connection with FIGS. 17, 18, and 19. It will be clear to anyone skilled in the art that the sampling phase error, gain error, and offset compensation techniques disclosed herein can be used independently of each other and in any combination required, depending on the need for compensation of the different errors that circuit design and/or manufacturing tolerance considerations motivate in each specific situation.

The M-path DSP 110 includes an M-path parallel FFE 1208, M individual decision and error paths, and an M-path DFE 1210. In an embodiment, the number of parallel ADC paths N equals the number of parallel DSP paths M. The invention is not, however, limited to this embodiment.

Figure 15:
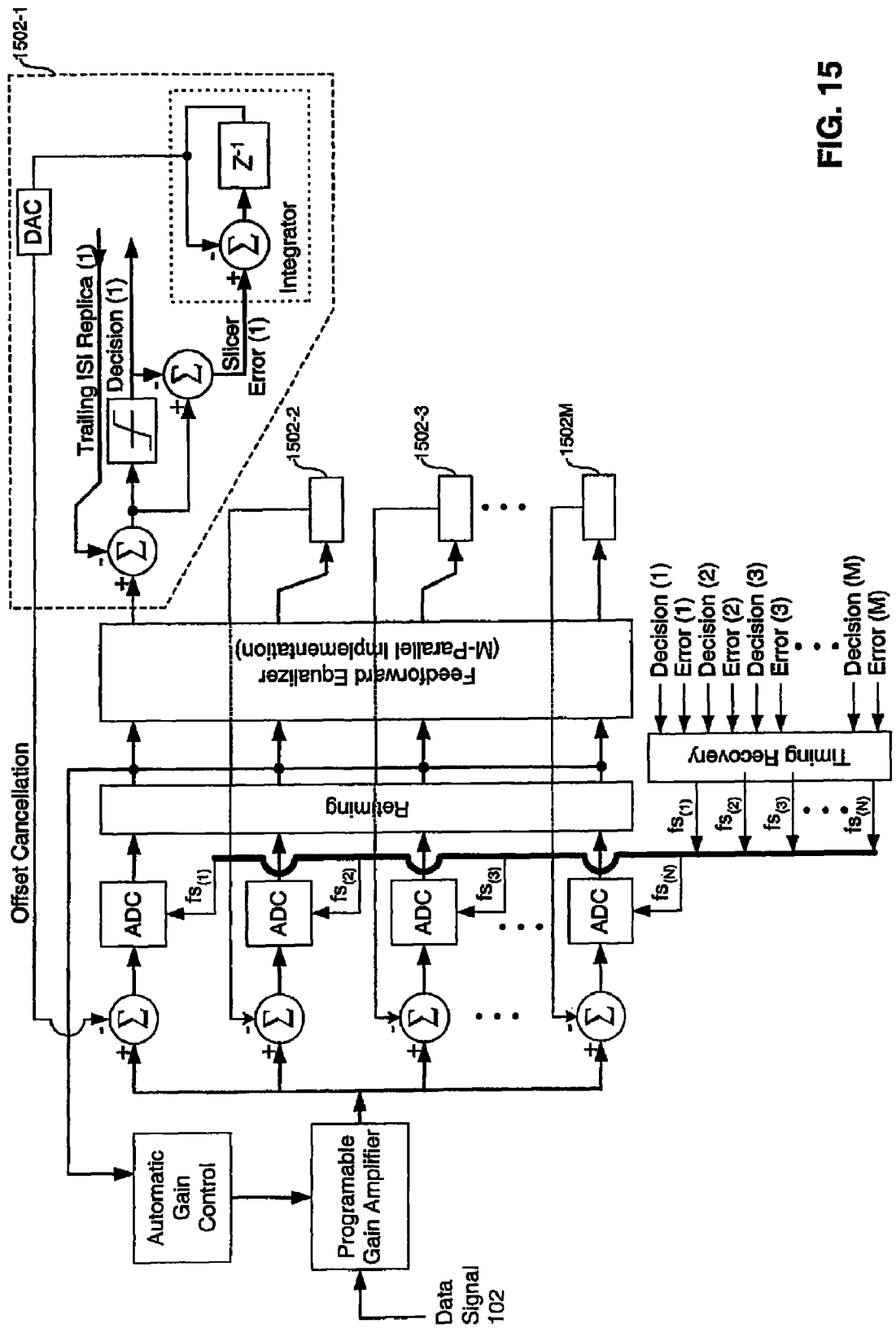
FIG. 15 illustrates an example implementation for offset mismatch compensation in accordance with an aspect of the present invention.

The example parallel receiver 1200 shows an implementation of a DFE and offset cancellation scheme that can not only compensate for offset, but can also compensate for offset mismatches among the interleaved array of ADC paths. In an embodiment, the offset cancellation scheme is implemented with one or more DC taps per ADC path in the DFE 1210. This approach is described in more detail in FIG. 16, where the DC taps are implemented by the integrators inside blocks 1602-1 through 1602-M. FIG. 15 also uses DC taps in the DFE to compensate for offsets independently for each ADC path, but in this case compensation is done in the analog domain. Since each interleave uses an independent, and independently adapted, DC tap, offsets that do not necessarily match across the interleaved paths can be compensated.

The timing recovery module 1018 receives decisions and errors from the M individual decision and error paths in the DSP 110, and adjusts the phases of the sampling clocks 1019-1 through 1019-N accordingly.

In the receiver 1200, gain factors are individually controlled for each path after the ADC array 108. Overall dynamic range of the ADC converter array 108 is optionally controlled by the AGC module 1010 and the PGA module 1008. This helps to optimize use of all of the bits of the ADC array 108.

Figure 13:
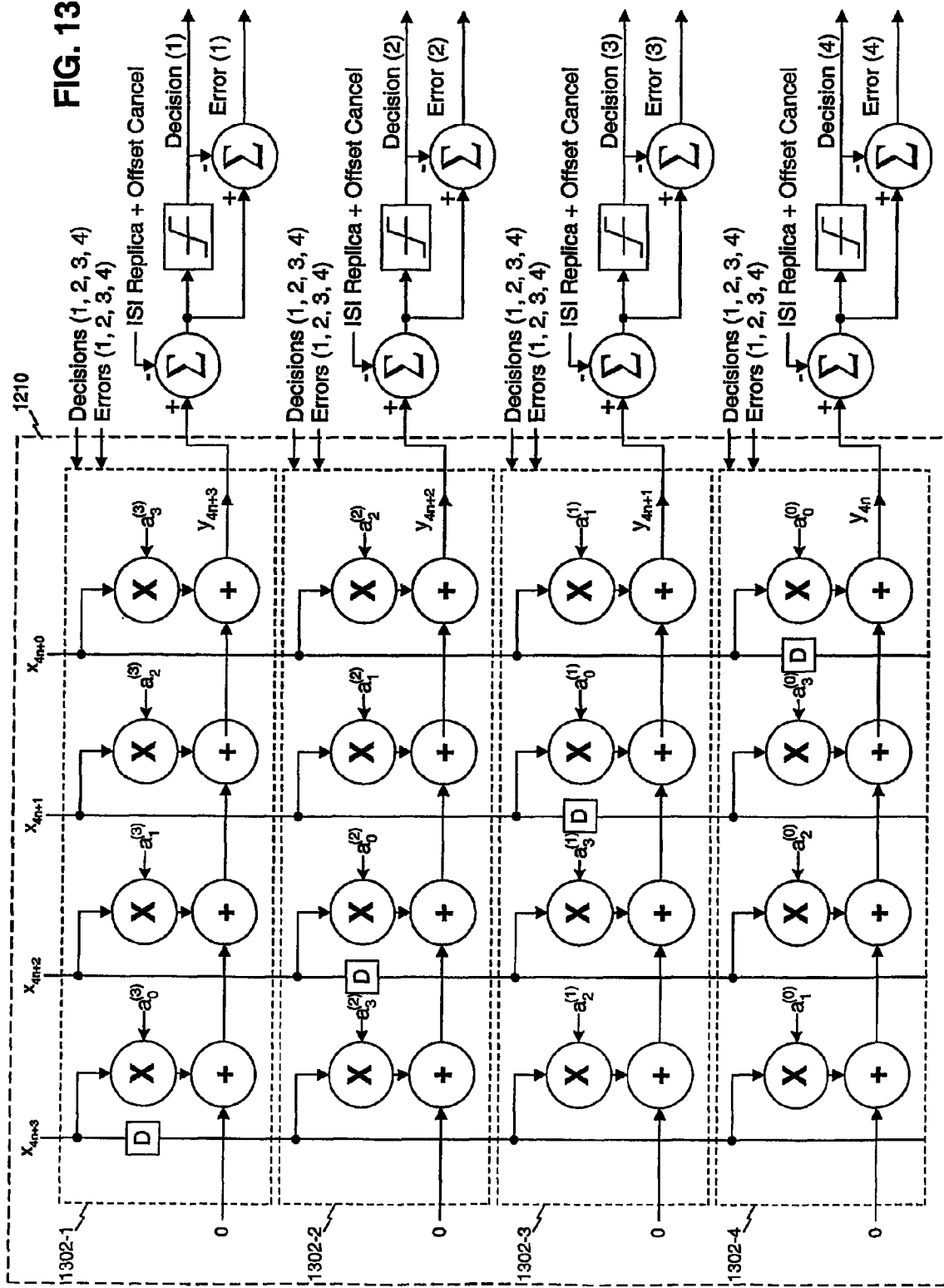
FIG. 13 illustrates example implementation details of the equalizer illustrated in FIG. 12, in accordance with an aspect of the present invention.

FIG. 13 illustrates an example of 4-tap adaptive FFE 1208 implemented as a 4-parallel array having paths 1302-1 through 1302-4. The number of taps and the degree of parallelization can be varied as desired. In the example implementation of FIG. 13, the parallel paths 1302-1 through 1302-4 are essentially four adaptive transversal filters.

For an ideal channel (i.e., a channel where there are no gain mismatches in the paths), it would be economical to share the coefficients of the filters in the paths 1302-1 through 1302-4.

In other words, it would be economical to make $a_r^{(0)}=a_r^{(1)}=a_r^{(2)}=a_r^{(3)}$ (r=0, . . . , 3) in FIG. 13. In practice, however, gain mismatches typically occur. By making the coefficients independent of one another, and adapting them independently, the coefficients of the M-paths will individually converge to potentially different values to compensate for gain errors of the lower frequency ADC s 1012-1 through 1012-N.

In addition to reducing gain mismatches in the paths, independent adaptation of the gain coefficients tends to reduce bandwidth mismatches in the paths, which otherwise could cause impulse responses of the paths to differ from one another.

2. Automatic Gain Control (AGC)

In accordance with an aspect of the invention, gain errors in the interleaved ADC paths are compensated for on a path by path basis, using path-specific AGCs, wherein gain factors adapt for individual paths. FIG. 14 illustrates an example path-specific AGC implementation, which can be utilized to reduce gain errors in the interleaved paths. The example path specific AGC implementation illustrated in FIG. 14 can be implemented in place of the FFE-based gain error compensation scheme illustrated in FIGS. 12 and 13. It can also be combined with offset compensation schemes like the ones discussed in connection with FIGS. 12 and 15.

FIG. 14 illustrates an implementation of a portion 1400 of the receiver 100 illustrated in FIG. 10A, in accordance with an aspect of the invention. The portion 1400 includes a plurality of path-specific AGCs 1410-1 through 1410-N, which control a PGA array of path-specific PGAs 1402-1 through 1402-N.

Path-specific AGCs 1410-1 through 1410-N are now described with reference to path-specific AGC 1401-1. Path-specific AGCs 1410-2 through 1410-N are configured similarly. Path-specific AGC 1410-1 includes an absolute value module 1404-1 and a lowpass filter 1406-1, which provides a measured amplitude 1408-1 to a differencer 1426-1. The differencer 1426-1 subtracts a desired amplitude 1412-1 from the measured amplitude 1408-1 and outputs a difference value 1414-1 to an adder 1416-1. The adder 1416-1 together with the accumulator 1422-1 constitute a digital integrator. The integrator integrates the difference value 1414-1 and outputs a PGA control value 1424-1 to PGA 1402-1. PGA control value 1424-1, or a portion thereof, is optionally provided to ADC 1012-1 to adjust a reference voltage therein. Path-specific AGCs 1410-2 through 1410-N operate in a similar fashion.

In the example of FIG. 14, gain errors are obtained or generated in the digital domain, and used to control the independent PGAs 1402-1 through 1402-N. Since the gain error is measured in the digital domain, any gain errors introduced by the lower frequency ADCs 1012-1 through 1012-N will be driven to approximately zero by the AGC circuitry.

The present invention is not, however, limited to this example. Based on the description herein, one skilled in the relevant art(s) will understand that automatic gain control can be implemented in other ways. For example, and without limitation, where gain mismatches of the interleaved ADC paths are relatively negligible, automatic gain control can be shared by all of the ADC paths, wherein the PGAs 1402-1 through 1402-N share a common control signal.

3. Analog Compensation

FIG. 15 illustrates an example implementation for gain and offset mismatch compensation, where offset associated with each ADC 1012-1 through 1012-N in the interleaved ADC array 108 is substantially cancelled in the analog domain. Analog cancellation can be utilized in place of, or in addition to digital cancellation. Offsets introduced by each of the lower frequency ADCs 1012-1 through 1012-N are preferably measured in the digital domain. Alternatively, offsets introduced by each of the lower frequency ADCs 1012-1 through 1012-N are measured in the analog domain.

In a similar way, the gain errors can be compensated for by controlling the reference voltage of the ADCs. In this case, the PGA can be shared across all the interleaves.

4. Alternative Implementations

Figure 16:
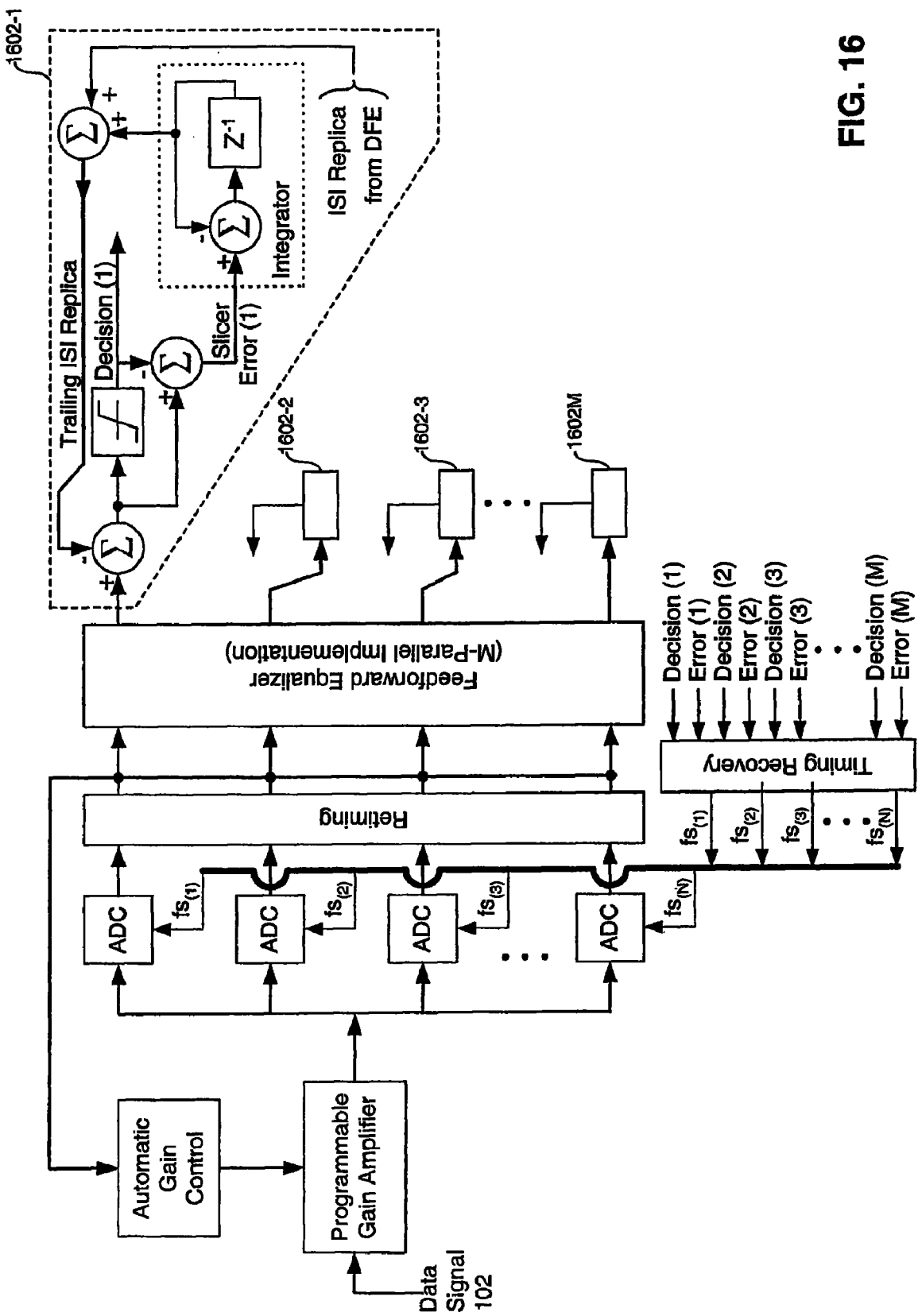
FIG. 16 illustrates another example implementation for offset mismatch compensation, in accordance with an aspect of the present invention.

FIG. 16 illustrates an exemplary receiver implementation that compensates offset mismatches. The exemplary implementation can be further modified to compensate gain errors between the ADC paths as well. Based on the description herein, one skilled in the relevant art(s) will understand that the exemplary implementation illustrated in FIG. 16 can be modified in a variety of ways to compensate for gain errors.

IV. PARALLEL EQUALIZATION

In accordance with an aspect of the present invention, one or more types of equalization are performed in an electrical and/or optical parallel multi-path receiver.

A. Parallelization of Viterbi Decoder

In an embodiment of the present invention, Viterbi equalization is performed in a multi-path receiver, including, without limitation, optical and/or electrical multi-path receivers.

Parallel Viterbi decoders are described in, for example, Fettweis and Meyr, "Parallel Viterbi Algorithm Implementation: Breaking the ACS-Bottleneck," *IEEE Transaction On Communications*, Vol. 37, No. 8, August 1989, and Pettweis and Meyr, "High-Rate Viterbi Processor: A Systolic Array Solution," *IEEE Transaction On Communications*, Vol. 37, No. 9, August 1990, both of which are incorporated herein by reference in their entireties.

In accordance with an aspect of the invention, Viterbi decoders are parallelized by the DSP parallelization factor M. This allows the Viterbi process to be run at a clock rate of $f_B/M$, where $f_B$ is the symbol rate of the receiver. For example, for $f_B$=3.125 GHz, and M=8, the Viterbi processor would run at a clock rate of 390.625 MHz. The invention is not, however, limited to this example.

For a given number of decoder states S, the amount of hardware needed for the parallel implementation generally grows linearly with the degree of parallelization M. This allows large parallelization factors M to be implemented, and makes implementation of Viterbi decoders feasible at relatively high symbol rates.

Parallelization is based on the idea of defining an M-step trellis (also with S states), which represents the state transitions after M symbol periods. Branch metrics for the M-step trellis can be computed using S "rooted trellises." Computation of the rooted trellises can be parallelized.

Figure 20:
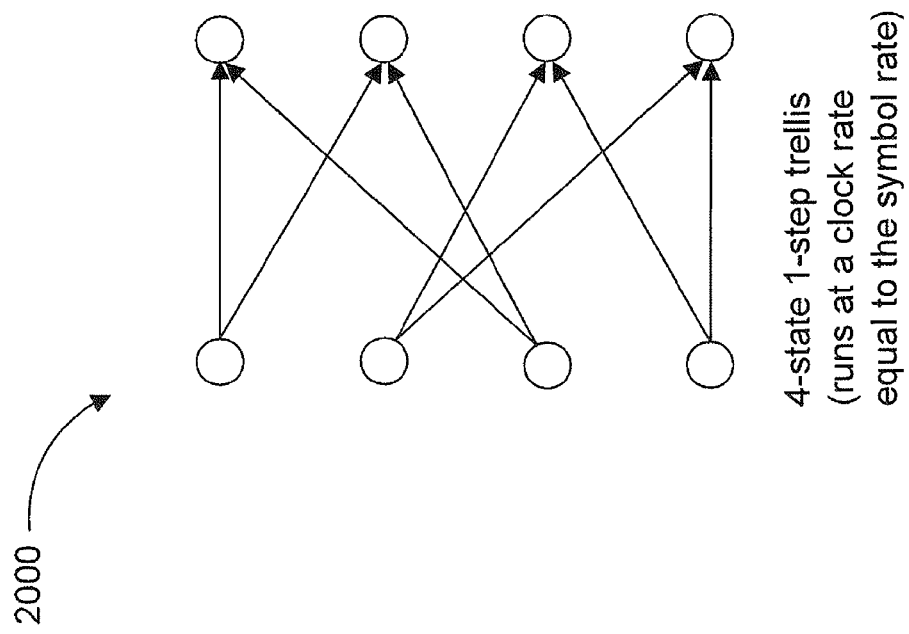
FIG. 20 illustrates an example 4-state, 1-step trellis that runs at a clock rate substantially equal to the symbol rate, in accordance with an aspect of the present invention.
Figure 22A:
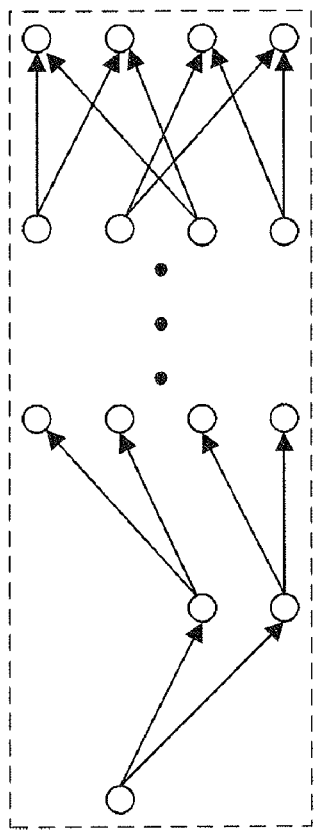
FIG. 22A illustrates an example rooted trellis, in accordance with an aspect of the present invention.
Figure 22B:
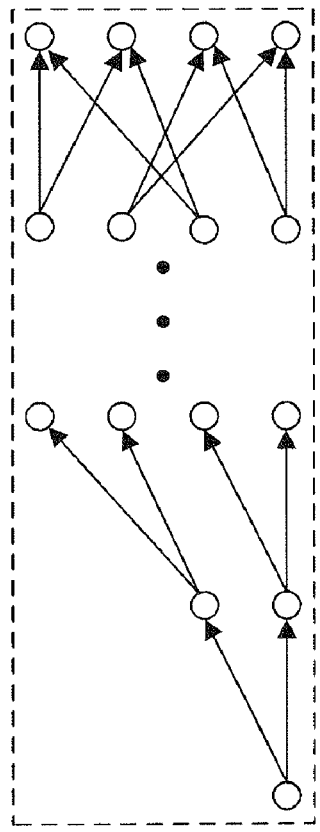
FIG. 22B illustrates another example rooted trellis, in accordance with an aspect of the present invention.
Figure 22C:
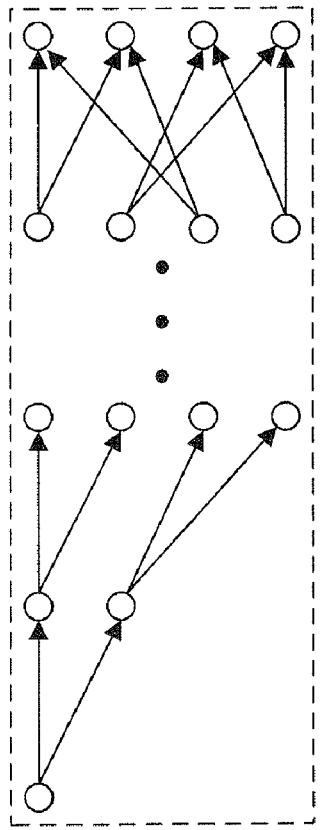
FIG. 22C illustrates another example rooted trellis, in accordance with an aspect of the present invention.
Figure 22D:
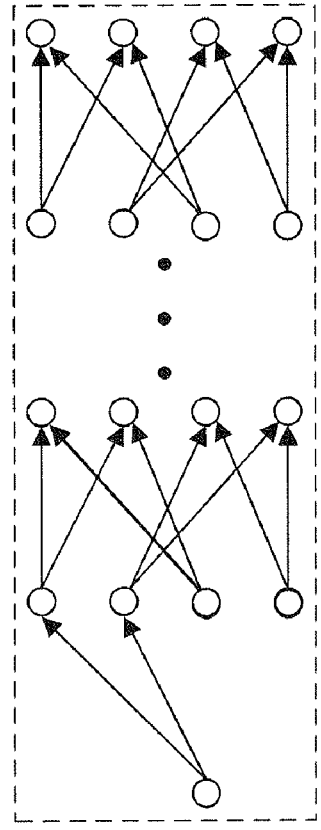
FIG. 22D illustrates another example rooted trellis, in accordance with an aspect of the present invention.

FIG. 20 illustrates an example 4-state, 1-step trellis 2000 that runs at a clock rate substantially equal to the symbol rate, in accordance with an aspect of the present invention.

Figure 21:
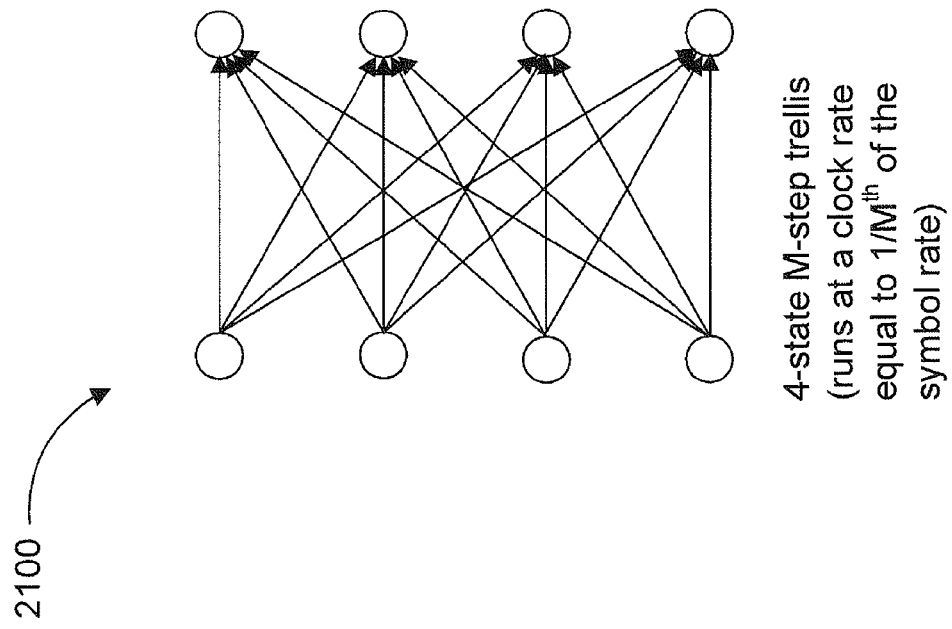
FIG. 21 illustrates an example 4-state, M-step trellis that runs at a clock rate substantially equal to $1/M^{th}$ of the symbol rate, in accordance with an aspect of the present invention.

FIG. 21 illustrates an example 4-state, M-step trellis 2100 that runs at a clock rate substantially equal to $1/M^{th}$ of the symbol rate, in accordance with an aspect of the present invention.

FIGS. 22A through 22D illustrate example rooted trellises, in accordance with aspects of the present invention.

FIG. 23 illustrates an example systolic implementation of rooted trellis computation, in accordance with an aspect the present invention.

FIG. 24 is a high level block diagram of an example parallel Viterbi processor in accordance with an aspect the present invention.

B. Example Parallel Equalization Implementations

In an embodiment, a receiver in accordance with the present invention is implemented to receive one or more optical signals over single mode and/or multi-mode fiber. For example, and without limitation, an optical transceiver utilizing forward equalization could achieve a reach of about 430 m on standard 62.5/125 μm multi-mode fiber at a rate of 3.125 Gb/s. A Viterbi-based transceiver could achieve a reach of about 670 m on standard 62.5/125 μm multi-mode fiber at the same rate. This is about 240 m more than a receiver based on FFE alone.

The present invention is not, however, limited to these example embodiments. Additional examples of parallel implementations of the DEE can be found in the article "Techniques for High-Speed Implementation of Nonlinear Cancellation" by S. Kasturia and J. Winters, *IEEE Journal on Selected Areas in Communications*, Vol. 9, Number 5, June 1991, pages 711-717, incorporated herein by reference in its entirety. Specifically, the present invention is useful for improving transmission of optical signals over single mode fiber as well as multi-mode fiber. The present invention is also useful for receiving electrical data signals.

V. ERROR CORRECTION

In an embodiment, the invention includes error correction processing. This processing can take place in the block labeled "Optional Processing" in FIG. 10B, or it could be done by the Viterbi decoder. Error correction processing includes, but is not limited to, hard-decision decoding or soft-decision decoding of convolutional, trellis, or block codes.

VI. CONCLUSIONS

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software, and the like, and/or combinations thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for processing a data signal, comprising:
   (1) receiving a data signal having a symbol rate;
   (2) generating N sampling signals having a frequency that is lower than the symbol rate, the N sampling signals shifted in phase relative to one another, wherein N is an integer greater than one;
   (3) controlling N analog-to-digital converter ("ADC") paths with the N sampling signals to sample the data signal at the phases to produce samples;
   (4) performing at least one M-path parallel digital process on the samples, wherein M is greater than N; and
   (5) generating a digital signal representation of the data signal from the samples.

2. The method according to claim 1, wherein step (4) further comprises equalizing the samples.

3. The method according to claim 2, wherein step (4) further comprises performing one or more of the following types of equalization processes on the samples:
   Viterbi equalization;
   feed-forward equalization; and
   decision feedback equalization.

4. The method according to claim 1, wherein step (4) comprises decoding a convolutional code.

5. The method according to claim 1, wherein step (4) comprises decoding a trellis code.

6. The method according to claim 1, wherein step (4) comprises decoding a block code.

7. The method according to claim 1, wherein M equals 2N.

8. A receiver, comprising:
   an analog-to-digital converter ("ADC") array of N ADC paths, wherein N is an integer greater than 1, each ADC path including an ADC path input coupled to a receiver input; and
   an M-path digital signal processor coupled to the ADC array, wherein M is greater than N.

9. The receiver according to claim 8, wherein the digital signal processor comprises an equalizer.

10. The receiver according to claim 9, wherein the equalizer comprises one or more of:
    a Viterbi equalizer;
    a feed-forward equalizer; and
    a decision feedback equalizer.

11. The receiver according to claim 8, wherein the digital signal processor comprises a convolutional decoder.

12. The receiver according to claim 8, wherein the digital signal processor comprises a trellis decoder.

13. The receiver according to claim 8, wherein the digital signal processor comprises a block decoder.

14. The receiver according to claim 8, wherein M equals 2N.

15. A receiver, comprising:
    means for receiving a data signal having a symbol rate;
    means for generating N sampling signals having a frequency that is lower than the symbol rate, the N sampling signals shifted in phase relative to one another, wherein N is an integer greater than one;
    means for controlling N analog-to-digital converter ("ADC") paths with the N sampling signals to sample the data signal at the phases to produce samples;
    means for performing at least one M-path parallel digital process on the samples, wherein M is greater than N; and
    means for generating a digital signal representation of the data signal from the samples.

16. The receiver according to claim 15, wherein the means for performing digital processes on the samples comprise means for equalizing the samples.

17. The receiver according to claim 16 wherein the means for equalizing comprises one or more of:
    performing a Viterbi equalization process in the samples;
    performing a feed-forward equalization process on the samples; and
    performing a decision feedback equalization process on the samples.

18. The receiver according to claim 15, wherein the means for performing the digital processes on the samples comprises means for decoding a convolutional code.

19. The receiver according to claim 15, wherein the means for performing the digital processes on the samples comprises means for decoding a trellis code.

20. The receiver according to claim 15, wherein the means for performing the digital processes on the samples comprises means for decoding a block code.

21. The receiver according to claim 15, wherein M equals 2N.

* * * * *